United States Patent
Lei et al.

(10) Patent No.: US 10,862,722 B2
(45) Date of Patent: Dec. 8, 2020

(54) REFERENCE SIGNAL TRANSMISSION TECHNIQUES FOR NON-ORTHOGONAL MULTIPLE ACCESS WIRELESS COMMUNICATIONS

(71) Applicant: QUALCOMM Incorporated, San Diego, CA (US)

(72) Inventors: Jing Lei, San Diego, CA (US); Renqiu Wang, San Diego, CA (US); Seyong Park, San Diego, CA (US); Naga Bhushan, San Diego, CA (US); Jay Kumar Sundararajan, San Diego, CA (US); Joseph Binamira Soriaga, San Diego, CA (US); Tingfang Ji, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 3 days.

(21) Appl. No.: 16/263,250

(22) Filed: Jan. 31, 2019

(65) Prior Publication Data
US 2019/0238367 A1   Aug. 1, 2019

Related U.S. Application Data

(60) Provisional application No. 62/625,151, filed on Feb. 1, 2018.

(51) Int. Cl.
*H04L 27/26* (2006.01)
*H04L 25/02* (2006.01)
(Continued)

(52) U.S. Cl.
CPC ....... *H04L 27/2613* (2013.01); *H04B 7/0452* (2013.01); *H04J 11/004* (2013.01);
(Continued)

(58) Field of Classification Search
CPC .... H04L 5/0048–0053; H04L 27/2613; H04B 7/0413; H04B 7/0452
See application file for complete search history.

(56) References Cited

U.S. PATENT DOCUMENTS

2017/0111147 A1   4/2017 Cao et al.
2018/0152907 A1*  5/2018 Zhang ................. H04W 74/006
(Continued)

FOREIGN PATENT DOCUMENTS

EP          3439218 A1     2/2019
WO    WO-2017171314 A1    10/2017

OTHER PUBLICATIONS

Intel Corporation: "On Spreading-based NOMA Schemes," 3GPP Draft; R1-1609500 Intel Spreading-Based NOMA Schemes, 3rd Generation Partnership Project (3GPP), Mobile Competence Centre; 650, Route Des Lucioles; F-06921 Sophia-Antipolis Cedex; France, vol. RAN WG1, No. Lisbon, Portugal; Oct. 10, 2016-Oct. 14, 2016, Oct. 9, 2016, XP051149539, 8 pages, Retrieved from the Internet: URL: http://www.3gpp.org/ftp/Meetings_3GPP_SYNC/RAN1/Docs/ [retrieved on Oct. 9, 2016],Section 2, p. 1-p. 2.
(Continued)

*Primary Examiner* — Marcus Smith
(74) *Attorney, Agent, or Firm* — Holland & Hart LLP

(57) ABSTRACT

Methods, systems, and devices for wireless communications are described that provide for concurrent reference signal transmissions using common resources, such as demodulation reference signal (DMRS) transmissions, from a number of non-orthogonal multiple access (NOMA) transmitters. Different transmitters may use different sequences for reference signal transmissions, which may allow a receiver, such as a wireless base station, to decode the reference signal transmissions for each NOMA transmitter and perform channel estimation for each NOMA transmitter. The reference signal transmissions may be asynchronous with a
(Continued)

bounded timing offset or quasi-synchronous, and the reference signal sequence selection may provide for relatively reliable channel estimation and coherent demodulation.

30 Claims, 24 Drawing Sheets

(51) Int. Cl.
    *H04L 5/00*         (2006.01)
    *H04B 7/0452*     (2017.01)
    *H04J 13/10*       (2011.01)
    *H04W 72/04*     (2009.01)
    *H04J 11/00*      (2006.01)
    *H04L 27/227*     (2006.01)
    *H04J 13/00*      (2011.01)
    *H03M 13/15*      (2006.01)
    *H04L 1/00*        (2006.01)
    *H04B 7/0413*     (2017.01)

(52) U.S. Cl.
    CPC ...... *H04J 13/0014* (2013.01); *H04J 13/0033* (2013.01); *H04J 13/0055* (2013.01); *H04J 13/0059* (2013.01); *H04J 13/107* (2013.01); *H04L 5/003* (2013.01); *H04L 5/0007* (2013.01); *H04L 5/0021* (2013.01); *H04L 5/0051* (2013.01); *H04L 5/0094* (2013.01); *H04L 25/0204* (2013.01); *H04L 27/227* (2013.01); *H03M 13/1505* (2013.01); *H04B 7/0413* (2013.01); *H04L 1/00* (2013.01); *H04L 5/0048* (2013.01); *H04L 5/0053* (2013.01); *H04L 27/26* (2013.01); *H04W 72/042* (2013.01)

(56) References Cited

U.S. PATENT DOCUMENTS

| | | | |
|---|---|---|---|
| 2019/0207731 A1* | 7/2019 | Park | H04W 16/28 |
| 2019/0245664 A1* | 8/2019 | Kim | H04L 5/00 |
| 2019/0254018 A1* | 8/2019 | Li | H04L 5/0005 |
| 2020/0008221 A1* | 1/2020 | Keating | H04W 72/085 |
| 2020/0015218 A1* | 1/2020 | Lee | H04L 5/00 |
| 2020/0053789 A1* | 2/2020 | Lee | H04L 5/00 |

OTHER PUBLICATIONS

International Search Report and Written Opinion—PCT/US2019/016388—ISA/EPO—Apr. 24, 2019 (181754WO).

ZTE: "Contention-based non-orthogonal Multiple Access for UL mMTC," 3GPP Draft; R1-164269 Multiple Access for MMTC, 3rd Generation Partnership Project (3GPP), Mobile Competence Centre; 650, Route Des Lucioles; F-06921 Sophia-Antipolis Cedex; France, vol. RAN WG1, No. Nanjing, China; May 23, 2016-May 27, 2016, May 14, 2016, XP051096507, 6 pages, Retrieved from the Internet: URL: http://www..3gpp.org/ftp/tsg_ran/WG1_RL1/TSGR1_85/Docs/ [retrieved on May 14, 2016].

ZTE, et al: "Summary of [86-18] Email Discussion on Categorization for NR MA Schemes," 3GPP Draft; R1-1608956 Summary of [86-18] Email Discussion on Categorization for NR MA Schemes, 3rd Generation Partnership Project (3GPP), Mobile Competence Centre; 650, Route Des Lucioles; F-06921 , vol. RAN WG1, No. Lisbon, Portugal; Oct. 10, 2016-Oct. 14, 2016, Oct. 18, 2016, XP051160528, 7 pages, Retrieved from the Internet: URL: http://www.3gpp.org/ftp/tsg_ran/WG1_RL1/TSGR1_86b/Docs/ [retrieved on Oct. 18, 2016] section 2.

* cited by examiner

REFERENCE SIGNAL TRANSMISSION TECHNIQUES FOR NON-ORTHOGONAL MULTIPLE ACCESS WIRELESS COMMUNICATIONS

CROSS REFERENCES

The present application for patent claims the benefit of U.S. Provisional Patent Application No. 62/625,151 by LEI, et al., entitled "Reference Signal Transmission Techniques For Non-Orthogonal Multiple Access Wireless Communications," filed Feb. 1, 2018, assigned to the assignee hereof, and expressly incorporated herein.

BACKGROUND

The following relates generally to wireless communication and to reference signal transmission techniques for non-orthogonal multiple access (NOMA) wireless communications.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform-spread-OFDM (DFT-S-OFDM). A wireless multiple-access communications system may include a number of base stations or network access nodes, each simultaneously supporting communication for multiple communication devices, which may be otherwise known as user equipment (UE).

SUMMARY

The described techniques relate to improved methods, systems, devices, or apparatuses that support reference signal transmission techniques for non-orthogonal multiple access (NOMA) wireless communications. Generally, the described techniques provide for concurrent reference signal transmissions using common resources, such as demodulation reference signal (DMRS) transmissions, from a number of NOMA transmitters. Different transmitters may use different sequences for reference signal transmissions, which may allow a receiver, such as a wireless base station, to decode the reference signal transmissions for each NOMA transmitter (e.g., each user equipment (UE) of a number of UEs) and perform channel estimation for each NOMA transmitter, which may enhance demodulation and decoding of data transmissions of the NOMA transmitters. In some cases, the reference signal transmissions may be asynchronous with a bounded timing offset or quasi synchronous, and the reference signal sequence selection may provide for relatively reliable channel estimation and coherent demodulation.

In some cases, the sequences used for the reference signal transmissions may be formed by concatenating a number of short sequences in the time domain, where each short sequence is applied to frequency resources in the frequency domain. In some cases, each short sequence of the number of short sequences may have a root index and cyclic shift that provides a cross-correlation with other of the short sequences that is below a threshold value. In some cases, the short sequences may be selected from a codebook of available short sequences that may be selected based on reference signal resources available for the reference signal transmissions. In some cases, the synthesis of the root sequence index and cyclic shift for the reference signal sequence may be performed by constructing shift sequences in the frequency domain and interleaving the shift sequences in the time domain. In some cases, the concatenated short sequences may follow coding constraints to provide error correcting codes.

In some cases, the sequences used for the reference signal transmissions may be formed by identifying, based at least in part on a size of configured reference signal resources, a square matrix having mutually orthogonal rows, and partitioning the square matrix to identify a reference signal sequence to be used for a reference signal transmission. In some cases, a first submatrix of the square matrix may be selected based at least in part on a distance between the NOMA transmitter and receiver, and segmenting the first submatrix into a number of short sequences to be included in the reference signal based on frequency resources and time resources within the configured reference signal resources. In some cases, the receiver that receives a number of concurrently transmitted reference signals over common resources may demodulate and decode the different reference signals based on the different reference signal sequences, and perform channel estimation for each of the NOMA transmitters for use in receiving other transmissions of each of the NOMA transmitters.

A method of wireless communication is described. The method may include receiving, from a base station, an indication of a set of resources for transmission of a reference signal, wherein a plurality of NOMA transmitters are configured for at least partially concurrent transmissions using the set of resources, identifying, based at least in part on the set of resources, a plurality of short sequences to be included in the reference signal, each short sequence of the plurality of short sequences having a root index and cyclic shift that provides a cross-correlation with other of the plurality of short sequences that is below a threshold value, concatenating the plurality of short sequences to generate a reference signal sequence for the reference signal, and transmitting the reference signal to the base station.

An apparatus for wireless communication is described. The apparatus may include means for receiving, from a base station, an indication of a set of resources for transmission of a reference signal, wherein a plurality of NOMA transmitters are configured for at least partially concurrent transmissions using the set of resources, means for identifying, based at least in part on the set of resources, a plurality of short sequences to be included in the reference signal, each short sequence of the plurality of short sequences having a root index and cyclic shift that provides a cross-correlation with other of the plurality of short sequences that is below a threshold value, means for concatenating the plurality of short sequences to generate a reference signal sequence for the reference signal, and means for transmitting the reference signal to the base station.

Another apparatus for wireless communication is described. The apparatus may include a processor, memory in electronic communication with the processor, and instructions stored in the memory. The instructions may be operable to cause the processor to receive, from a base station, an indication of a set of resources for transmission of a reference signal, wherein a plurality of NOMA transmitters are configured for at least partially concurrent transmissions using the set of resources, identify, based at least in part on the set of resources, a plurality of short sequences to be included in the reference signal, each short sequence of the plurality of short sequences having a root index and cyclic shift that provides a cross-correlation with other of the plurality of short sequences that is below a threshold value, concatenate the plurality of short sequences to generate a reference signal sequence for the reference signal, and transmit the reference signal to the base station.

A non-transitory computer-readable medium for wireless communication is described. The non-transitory computer-readable medium may include instructions operable to cause a processor to receive, from a base station, an indication of a set of resources for transmission of a reference signal, wherein a plurality of NOMA transmitters are configured for at least partially concurrent transmissions using the set of resources, identify, based at least in part on the set of resources, a plurality of short sequences to be included in the reference signal, each short sequence of the plurality of short sequences having a root index and cyclic shift that provides a cross-correlation with other of the plurality of short sequences that is below a threshold value, concatenate the plurality of short sequences to generate a reference signal sequence for the reference signal, and transmit the reference signal to the base station.

In some examples of the method, apparatus, and non-transitory computer-readable medium described above, the set of resources comprise frequency resources and time resources, and wherein a first short sequence of the plurality of short sequences may be applied to a first subset of the frequency resources that may be located within a first subset of the time resources, and a second short sequence of the plurality of short sequences may be applied to a second subset of the frequency resources that may be located within a second subset of the time resources.

In some examples of the method, apparatus, and non-transitory computer-readable medium described above, the identifying the plurality of short sequences includes determining the root index and cyclic shift for each short sequence within a plurality of frequency domain resources. Some examples of the method, apparatus, and non-transitory computer-readable medium described above may further include processes, features, means, or instructions for mapping each of the plurality of short sequences to each of a corresponding plurality of time domain resources. In some examples of the method, apparatus, and non-transitory computer-readable medium described above, the plurality of short sequences each comprise a portion of a linear block code that can be successfully decoded if an error in receiving one or more portions of the linear block code occurs. In some examples of the method, apparatus, and non-transitory computer-readable medium described above, the linear block code may be an error-correcting code.

In some examples of the method, apparatus, and non-transitory computer-readable medium described above, the threshold value may be based at least in part on a one or more of a cell radius of the base station, a multipath delay spread associated with the base station, or any combination thereof. In some examples of the method, apparatus, and non-transitory computer-readable medium described above, the reference signal sequence allows for asynchronous reference signal transmissions from multiple transmitters.

In some examples of the method, apparatus, and non-transitory computer-readable medium described above, the identifying the plurality of short sequences includes identifying, based at least in part on the set of resources, a codebook containing a set of short sequences. Some examples of the method, apparatus, and non-transitory computer-readable medium described above may further include processes, features, means, or instructions for selecting a subset of the set of short sequences as the plurality of short sequences based at least in part on a UE identification. In some examples of the method, apparatus, and non-transitory computer-readable medium described above, each short sequence of the plurality of short sequences may be a constant-amplitude zero-autocorrelation (CAZAC) sequence, a pseudo-random noise (PN) sequence, a Kasami sequence, or a Golay sequence. In some examples of the method, apparatus, and non-transitory computer-readable medium described above, the receiving the indication of the set of resources comprises receiving RRC signaling, a synchronization signal block, a broadcast signal, a system information block, or any combination thereof.

A method of wireless communication is described. The method may include allocating, at a base station, a set of resources for transmission of a plurality of at least partially concurrent reference signal transmissions from a plurality of NOMA transmitters, transmitting an indication of the set of resources to the plurality of NOMA transmitters, identifying, based at least in part on the set of resources, a codebook of available short sequences to be concatenated to form a reference signal sequence at each of the plurality of NOMA transmitters, each short sequence of the codebook of available short sequences having a root index and cyclic shift that provides a cross-correlation with other of the codebook of available short sequences that is below a threshold value, receiving two or more reference signal transmissions from at least a subset of the plurality of NOMA transmitters, and estimating one or more channel characteristics of each of the subset of the plurality of NOMA transmitters based at least in part on the reference signal sequence of each of the plurality of NOMA transmitters.

An apparatus for wireless communication is described. The apparatus may include means for allocating, at a base station, a set of resources for transmission of a plurality of at least partially concurrent reference signal transmissions from a plurality of NOMA transmitters, means for transmitting an indication of the set of resources to the plurality of NOMA transmitters, means for identifying, based at least in part on the set of resources, a codebook of available short sequences to be concatenated to form a reference signal sequence at each of the plurality of NOMA transmitters, each short sequence of the codebook of available short sequences having a root index and cyclic shift that provides a cross-correlation with other of the codebook of available short sequences that is below a threshold value, means for receiving two or more reference signal transmissions from at least a subset of the plurality of NOMA transmitters, and means for estimating one or more channel characteristics of each of the subset of the plurality of NOMA transmitters based at least in part on the reference signal sequence of each of the plurality of NOMA transmitters.

Another apparatus for wireless communication is described. The apparatus may include a processor, memory in electronic communication with the processor, and instructions stored in the memory. The instructions may be operable to cause the processor to allocate, at a base station, a set of resources for transmission of a plurality of at least partially concurrent reference signal transmissions from a plurality of NOMA transmitters, transmit an indication of the set of resources to the plurality of NOMA transmitters, identify, based at least in part on the set of resources, a codebook of available short sequences to be concatenated to form a reference signal sequence at each of the plurality of NOMA transmitters, each short sequence of the codebook of available short sequences having a root index and cyclic shift that provides a cross-correlation with other of the codebook of available short sequences that is below a threshold value, receive two or more reference signal transmissions from at least a subset of the plurality of NOMA transmitters, and estimate one or more channel characteristics of each of the subset of the plurality of NOMA transmitters based at least in part on the reference signal sequence of each of the plurality of NOMA transmitters.

A non-transitory computer-readable medium for wireless communication is described. The non-transitory computer-readable medium may include instructions operable to cause a processor to allocate, at a base station, a set of resources for transmission of a plurality of at least partially concurrent reference signal transmissions from a plurality of NOMA transmitters, transmit an indication of the set of resources to the plurality of NOMA transmitters, identify, based at least in part on the set of resources, a codebook of available short sequences to be concatenated to form a reference signal sequence at each of the plurality of NOMA transmitters, each short sequence of the codebook of available short sequences having a root index and cyclic shift that provides a cross-correlation with other of the codebook of available short sequences that is below a threshold value, receive two or more reference signal transmissions from at least a subset of the plurality of NOMA transmitters, and estimate one or more channel characteristics of each of the subset of the plurality of NOMA transmitters based at least in part on the reference signal sequence of each of the plurality of NOMA transmitters.

In some examples of the method, apparatus, and non-transitory computer-readable medium described above, the set of resources comprise frequency resources and time resources, and a first short sequence of the codebook of available short sequences may be applied to a first subset of the frequency resources that may be located within a first subset of the time resources, and a second short sequence of the codebook of available short sequences may be applied to a second subset of the frequency resources that may be located within a second subset of the time resources. In some examples of the method, apparatus, and non-transitory computer-readable medium described above, the codebook of available short sequences identifies the root index and cyclic shift for each short sequence within a plurality of frequency domain resources, and maps each of the short sequences to each of a corresponding plurality of time domain resources. In some examples of the method, apparatus, and non-transitory computer-readable medium described above, the available short sequences each comprise a portion of a linear block code that can be successfully decoded if an error in receiving one or more portions of the linear block code occurs. In some examples of the method, apparatus, and non-transitory computer-readable medium described above, the linear block code may be an error-correcting code.

In some examples of the method, apparatus, and non-transitory computer-readable medium described above, the threshold value may be based at least in part on a one or more of a cell radius of the base station, a multipath delay spread associated with the base station, or any combination thereof. In some examples of the method, apparatus, and non-transitory computer-readable medium described above, the reference signal sequence allows for asynchronous reference signal transmissions from multiple NOMA transmitters.

Some examples of the method, apparatus, and non-transitory computer-readable medium described above may further include processes, features, means, or instructions for performing successive interference cancellation on the two or more reference signal transmissions to identify a first reference signal transmission from a first NOMA transmitter. Some examples of the method, apparatus, and non-transitory computer-readable medium described above may further include processes, features, means, or instructions for identifying, based at least in part on the first reference signal transmission, a UE identification of the first NOMA transmitter. In some examples of the method, apparatus, and non-transitory computer-readable medium described above, each short sequence of the codebook of available short sequences may be a CAZAC sequence, a PN sequence, a Kasami sequence, or a Golay sequence.

A method of wireless communication is described. The method may include receiving, from a base station, an indication of a set of resources for transmission of a reference signal, the set of resources including a first subset of frequency resources and a second subset of time resources, and wherein a plurality of NOMA transmitters are configured for at least partially concurrent transmissions using the set of resources, identifying, based at least in part on a size of the first subset of frequency resources and the second subset of time resources, a square matrix having mutually orthogonal rows, selecting a first submatrix of the square matrix based at least in part on a distance to the base station, segmenting the first submatrix into a number of short sequences to be included in the reference signal, each short sequence of the number of short sequences having a length that corresponds to the first subset of frequency resources and the number of short sequences corresponding to a number of time resources within the second subset of time resources, and transmitting the reference signal to the base station using the set of resources.

An apparatus for wireless communication is described. The apparatus may include means for receiving, from a base station, an indication of a set of resources for transmission of a reference signal, the set of resources including a first subset of frequency resources and a second subset of time resources, and wherein a plurality of NOMA transmitters are configured for at least partially concurrent transmissions using the set of resources, means for identifying, based at least in part on a size of the first subset of frequency resources and the second subset of time resources, a square matrix having mutually orthogonal rows, means for selecting a first submatrix of the square matrix based at least in part on a distance to the base station, means for segmenting the first submatrix into a number of short sequences to be included in the reference signal, each short sequence of the number of short sequences having a length that corresponds to the first subset of frequency resources and the number of short sequences corresponding to a number of time resources within the second subset of time resources, and means for transmitting the reference signal to the base station using the set of resources.

Another apparatus for wireless communication is described. The apparatus may include a processor, memory in electronic communication with the processor, and instructions stored in the memory. The instructions may be operable to cause the processor to receive, from a base station, an indication of a set of resources for transmission of a reference signal, the set of resources including a first subset of frequency resources and a second subset of time resources, and wherein a plurality of NOMA transmitters are configured for at least partially concurrent transmissions using the set of resources, identify, based at least in part on a size of the first subset of frequency resources and the second subset of time resources, a square matrix having mutually orthogonal rows, select a first submatrix of the square matrix based at least in part on a distance to the base station, segment the first submatrix into a number of short sequences to be included in the reference signal, each short sequence of the number of short sequences having a length that corresponds to the first subset of frequency resources and the number of short sequences corresponding to a number of time resources within the second subset of time resources, and transmit the reference signal to the base station using the set of resources.

A non-transitory computer-readable medium for wireless communication is described. The non-transitory computer-readable medium may include instructions operable to cause a processor to receive, from a base station, an indication of a set of resources for transmission of a reference signal, the set of resources including a first subset of frequency resources and a second subset of time resources, and wherein a plurality of NOMA transmitters are configured for at least partially concurrent transmissions using the set of resources, identify, based at least in part on a size of the first subset of frequency resources and the second subset of time resources, a square matrix having mutually orthogonal rows, select a first submatrix of the square matrix based at least in part on a distance to the base station, segment the first submatrix into a number of short sequences to be included in the reference signal, each short sequence of the number of short sequences having a length that corresponds to the first subset of frequency resources and the number of short sequences corresponding to a number of time resources within the second subset of time resources, and transmit the reference signal to the base station using the set of resources.

Some examples of the method, apparatus, and non-transitory computer-readable medium described above may further include processes, features, means, or instructions for receiving a reference signal length indication from the base station, and the selection of the first submatrix may be based at least in part on the reference signal length indication. Some examples of the method, apparatus, and non-transitory computer-readable medium described above may further include processes, features, means, or instructions for estimating the distance to the base station based at least in part on a broadcast transmission from the base station. In some examples of the method, apparatus, and non-transitory computer-readable medium described above, the square matrix may be a Hadamard matrix having a size that may be based at least in part on the first subset of frequency resources and the second subset of time resources.

In some examples of the method, apparatus, and non-transitory computer-readable medium described above, the selecting the first submatrix includes selecting a subset of rows of the square matrix. Some examples of the method, apparatus, and non-transitory computer-readable medium described above may further include processes, features, means, or instructions for performing, for each row of the subset of rows, an inverse discrete Fourier transform (IDFT) to generate a set of prototype sequences.

In some examples of the method, apparatus, and non-transitory computer-readable medium described above, the segmenting the first submatrix into the number of short sequences includes identifying a number of symbols within the second subset of time resources, segmenting the set of prototype sequences into a plurality of sub-sequences based at least in part on the number of symbols, and performing, on each sub-sequence, a discrete Fourier transform (DFT) to generate a frequency-domain sub-sequence. Some examples of the method, apparatus, and non-transitory computer-readable medium described above may further include processes, features, means, or instructions for mapping each frequency-domain sub-sequence to each symbol of the number symbols.

In some examples of the method, apparatus, and non-transitory computer-readable medium described above, the receiving the indication of the set of resources comprises receiving RRC signaling, a synchronization signal block, a broadcast signal, a system information block, or any combination thereof.

A method of wireless communication is described. The method may include transmitting an indication of a set of resources to a plurality of NOMA transmitters, the set of resources including a first subset of frequency resources and a second subset of time resources for transmission of a plurality of at least partially concurrent reference signal transmissions, identifying, based at least in part on a size of the first subset of frequency resources and the second subset of time resources, a square matrix having mutually orthogonal rows, selecting a first submatrix of the square matrix based at least in part on a distance to at least a first NOMA transmitter of the plurality of NOMA transmitters, segmenting the first submatrix into a number of short sequences to be included in a first reference signal transmitted by the first NOMA transmitter, each short sequence of the number of short sequences having a length that corresponds to the first subset of frequency resources and the number of short sequences corresponding to a number of time resources within the second subset of time resources, receiving two or more reference signal transmissions, including the first reference signal and at least one other reference signal from one or more other NOMA transmitters of the plurality of NOMA transmitters, and estimating one or more channel characteristics of the first NOMA transmitter based at least in part on the short sequences included in the first reference signal.

An apparatus for wireless communication is described. The apparatus may include means for transmitting an indication of a set of resources to a plurality of NOMA transmitters, the set of resources including a first subset of frequency resources and a second subset of time resources for transmission of a plurality of at least partially concurrent reference signal transmissions, means for identifying, based at least in part on a size of the first subset of frequency resources and the second subset of time resources, a square matrix having mutually orthogonal rows, means for selecting a first submatrix of the square matrix based at least in part on a distance to at least a first NOMA transmitter of the plurality of NOMA transmitters, means for segmenting the first submatrix into a number of short sequences to be included in a first reference signal transmitted by the first NOMA transmitter, each short sequence of the number of short sequences having a length that corresponds to the first subset of frequency resources and the number of short sequences corresponding to a number of time resources within the second subset of time resources, means for receiving two or more reference signal transmissions, including the first reference signal and at least one other reference signal from one or more other NOMA transmitters of the plurality of NOMA transmitters, and means for estimating one or more channel characteristics of the first NOMA transmitter based at least in part on the short sequences included in the first reference signal.

Another apparatus for wireless communication is described. The apparatus may include a processor, memory in electronic communication with the processor, and instructions stored in the memory. The instructions may be operable to cause the processor to transmit an indication of a set of resources to a plurality of NOMA transmitters, the set of resources including a first subset of frequency resources and a second subset of time resources for transmission of a plurality of at least partially concurrent reference signal transmissions, identify, based at least in part on a size of the first subset of frequency resources and the second subset of time resources, a square matrix having mutually orthogonal rows, select a first submatrix of the square matrix based at least in part on a distance to at least a first NOMA transmitter of the plurality of NOMA transmitters, segment the first submatrix into a number of short sequences to be included in a first reference signal transmitted by the first NOMA transmitter, each short sequence of the number of short sequences having a length that corresponds to the first subset of frequency resources and the number of short sequences corresponding to a number of time resources within the second subset of time resources, receive two or more reference signal transmissions, including the first reference signal and at least one other reference signal from one or more other NOMA transmitters of the plurality of NOMA transmitters, and estimate one or more channel characteristics of the first NOMA transmitter based at least in part on the short sequences included in the first reference signal.

A non-transitory computer-readable medium for wireless communication is described. The non-transitory computer-readable medium may include instructions operable to cause a processor to transmit an indication of a set of resources to a plurality of NOMA transmitters, the set of resources including a first subset of frequency resources and a second subset of time resources for transmission of a plurality of at least partially concurrent reference signal transmissions, identify, based at least in part on a size of the first subset of frequency resources and the second subset of time resources, a square matrix having mutually orthogonal rows, select a first submatrix of the square matrix based at least in part on a distance to at least a first NOMA transmitter of the plurality of NOMA transmitters, segment the first submatrix into a number of short sequences to be included in a first reference signal transmitted by the first NOMA transmitter, each short sequence of the number of short sequences having a length that corresponds to the first subset of frequency resources and the number of short sequences corresponding to a number of time resources within the second subset of time resources, receive two or more reference signal transmissions, including the first reference signal and at least one other reference signal from one or more other NOMA transmitters of the plurality of NOMA transmitters, and estimate one or more channel characteristics of the first NOMA transmitter based at least in part on the short sequences included in the first reference signal.

Some examples of the method, apparatus, and non-transitory computer-readable medium described above may further include processes, features, means, or instructions for transmitting a reference signal length indication to the first NOMA transmitter, and wherein the selecting the first submatrix may be based at least in part on the reference signal length indication. Some examples of the method, apparatus, and non-transitory computer-readable medium described above may further include processes, features, means, or instructions for estimating the distance to the first NOMA transmitter based at least in part on a transmission from the first NOMA transmitter. In some examples of the method, apparatus, and non-transitory computer-readable medium described above, the square matrix may be a Hadamard matrix having a size that may be based at least in part on the first subset of frequency resources and the second subset of time resources.

In some examples of the method, apparatus, and non-transitory computer-readable medium described above, the selecting the first submatrix includes selecting a subset of rows of the square matrix. Some examples of the method, apparatus, and non-transitory computer-readable medium described above may further include processes, features, means, or instructions for performing, for each row of the subset of rows, an IDFT to generate a set of prototype sequences.

In some examples of the method, apparatus, and non-transitory computer-readable medium described above, the segmenting the first submatrix into the number of short sequences includes identifying a number of time resources within the second subset of time resources, segmenting the set of prototype sequences into a plurality of sub-sequences based at least in part on the number of time resources, and performing, on each sub-sequence, a DFT to generate a frequency-domain sub-sequence. Some examples of the method, apparatus, and non-transitory computer-readable medium described above may further include processes, features, means, or instructions for mapping each frequency-domain sub-sequence to each of the number of time resources.

DETAILED DESCRIPTION

Figure 1:
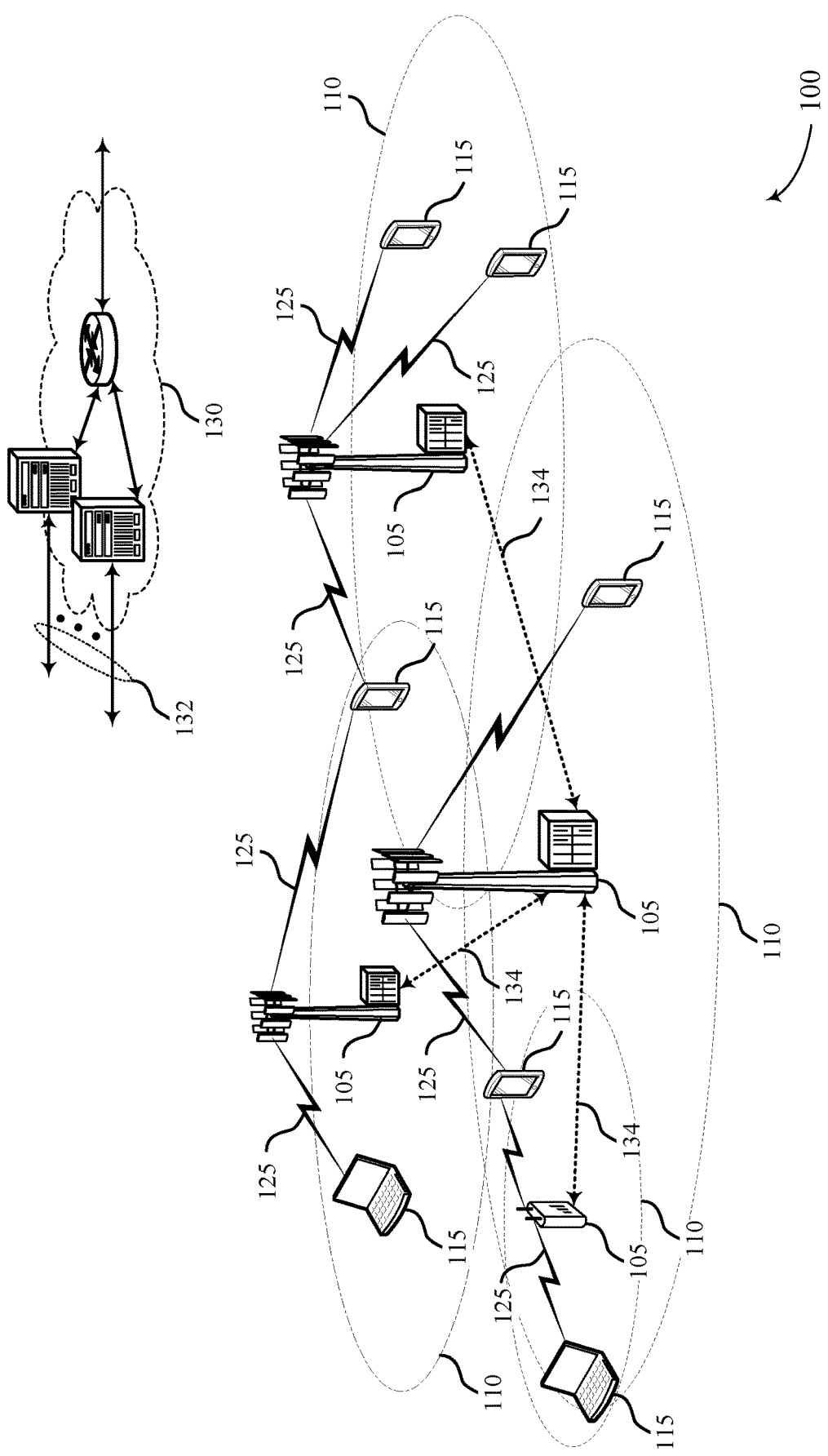
FIG. 1 illustrates an example of a system for wireless communication that supports reference signal transmission techniques for non-orthogonal multiple access (NOMA) wireless communications in accordance with aspects of the present disclosure.

Some wireless communications systems may support multiple access techniques for multiple users by sharing available system resources (e.g., time, frequency, and power). In some cases, non-orthogonal multiple access (NOMA) techniques may outperform orthogonal multiple access (OMA) techniques, and may allow multiple different transmitters to transmit concurrent transmissions over common system resources. NOMA techniques may enable access to more system bandwidth for transmitting devices (e.g., a user equipment (UE)), while simultaneously enabling a greater number of users to communicate on a set of time/frequency resources. As an example, using OMA techniques, orthogonal time/frequency/spatial resources may be allocated to three UEs such that, if each UE transmits using a single transmission antenna, three receive antennas may be used at a receiver (e.g., a base station), which may be representative of a 1×3 single-input, multiple-output (SIMO) transmission. By contrast, NOMA techniques may enable multiple UEs to concurrently transmit using the same time/frequency/spatial resources.

NOMA techniques that enable the recovery of multiple concurrent transmissions include, for example, successive interference cancelation (SIC), multi-user decoders (MUDs), resource spread multiple access (RSMA), or combinations thereof. A MUD may use SIC techniques to decode a first, relatively strong, signal from a first transmitter, subtract the first signal from the received signal, decode a second signal from a second transmitter, and so on. RSMA techniques may utilize lower rate channel coding that spreads a transmitted signal across resources. Gains obtained from the channel coding may lead to robust transmissions, and also may be well suited for sporadic transmissions of small non-orthogonal data bursts. For example, RSMA techniques may be beneficial in systems that support machine type communication (MTC), enhanced MTC (eMTC), narrowband Internet of Things (NB-IoT) communications, and the like. In such cases, signals from multiple transmitting devices may be recovered simultaneously, even in the presence of mutual interference.

As described herein, through the use of NOMA techniques, greater scheduling flexibility may be provided for multiple access by a large number of UEs (e.g., for massive machine-type communications (mMTC) systems), while also supporting robust communications with varying channel code rates. Various of the NOMA techniques discussed herein may use reference signal transmissions (e.g., demodulation reference signal (DMRS) transmissions) of each NOMA transmitter for channel estimation, which may provide for more robust demodulation and decoding of associated data transmissions for each NOMA transmitter. However, if a number of different NOMA transmitters use orthogonal reference signal resources for channel estimation, and the orthogonal reference signal resources support fewer NOMA transmitters than are ready to transmit during a time period, the use of orthogonal reference signal resources may be a bottleneck for system access.

According to various techniques provided herein, different NOMA transmitters may use different sequences for concurrent reference signal transmissions, which may allow a receiver to decode, from a number of concurrent reference signal transmissions, the reference signal transmissions for each NOMA transmitter and perform channel estimation for each NOMA transmitter. In some cases, the reference signal transmissions may be asynchronous with a bounded timing offset or quasi-synchronous, and the reference signal sequence selection may provide for relatively reliable channel estimation and coherent demodulation.

In some cases, the sequences used for the reference signal transmissions may be formed by concatenating a number of short sequences in the time domain, where each short sequence is applied to frequency domain resources. In some cases, each short sequence of the number of short sequences may have a root index and cyclic shift that provides a cross-correlation with other of the short sequences that is below a threshold value. In some cases, the short sequences may be selected from a codebook of available short sequences, and the codebook may be selected from a number of different available codebooks based on reference signal resources available for the reference signal transmissions. In some cases, the synthesis of the root sequence index and cyclic shift for the reference signal sequence may be performed by constructing shift sequences in the frequency domain and interleaving the shift sequences in the time domain. In some cases, the concatenated short sequences may follow coding constraints to provide error correcting codes, such that if one of the short sequences is lost the reference signal sequence may still be decoded at the receiver.

In some cases, the sequences used for the reference signal transmissions may be formed by identifying, based at least in part on a size of configured reference signal resources, a square matrix having mutually orthogonal rows (e.g., a Hadamard matrix), and partitioning the square matrix to identify a reference signal sequence to be used for a reference signal transmission. In some cases, a first submatrix of the square matrix may be selected based at least in part on a distance between the NOMA transmitter and receiver, and the first submatrix may be segmented into a number of short sequences to be included in the reference signal based on frequency resources and time resources within the configured reference signal resources. In some cases, the receiver of a number of concurrently transmitted reference signals over common resources may demodulate and decode the different reference signals based on the different reference signal sequences, and perform channel estimation for each of the NOMA transmitters for use in receiving other transmissions of each of the NOMA transmitters.

Various reference signal sequences that are generated in accordance with techniques such as discussed herein may thus provide different reference signal sequences having a cross-correlation with other of the plurality of short sequences that is below a threshold value. In some cases, the threshold value is based at least in part on a one or more of a cell radius of the base station, a multipath delay spread associated with the base station, or any combination thereof, and the reference signal sequence may allow for asynchronous or quasi-synchronous reference signal transmissions from multiple NOMA transmitters. Such reference signal transmission may help to enhance the spectrum efficiency and the capacity of massive connectivity systems (e.g., mMTC systems) by advantageously allowing relatively large overloading factors for a constrained resource size. Sequences provided herein also simplify the implementation of transmitters (e.g., UEs) and receivers (e.g., base stations) by providing efficient sequence generation.

Aspects of the disclosure are initially described in the context of a wireless communications system. Various examples of generation and selection of reference signal sequences for NOMA transmitters and receivers are then discussed. Aspects of the disclosure are further illustrated by and described with reference to apparatus diagrams, system diagrams, and flowcharts that relate to reference signal transmission techniques for NOMA wireless communications.

FIG. 1 illustrates an example of a wireless communications system 100 in accordance with various aspects of the present disclosure. The wireless communications system 100 includes base stations 105, UEs 115, and a core network 130. In some examples, the wireless communications system 100 may be a Long Term Evolution (LTE) network, an LTE-Advanced (LTE-A) network, an LTE-A Pro network, or a New Radio (NR) network. In some cases, wireless communications system 100 may support enhanced broadband communications, ultra-reliable (e.g., mission critical) communications, low latency communications, or communications with low-cost and low-complexity devices. UEs 115 and base stations 105 may implement NOMA communications in accordance with techniques discussed herein, in which reference signal sequences for reference signal transmissions may be selected to enhance channel estimation, demodulation, and decoding.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation Node B or giga-nodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions from a base station 105 to a UE 115. Downlink transmissions may also be called forward link transmissions while uplink transmissions may also be called reverse link transmissions.

The geographic coverage area 110 for a base station 105 may be divided into sectors making up only a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A/LTE-A Pro or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging. In some cases, MTC devices may use NOMA transmission techniques to provide multiple concurrent transmissions using common transmission resources, which may enhance network efficiency.

Base stations 105 may communicate with the core network 130 and with one another. For example, base stations 105 may interface with the core network 130 through backhaul links 132 (e.g., via an S1 or other interface). Base stations 105 may communicate with one another over backhaul links 134 (e.g., via an X2 or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 MHz to 300 GHz. Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that can tolerate interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology, or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a CA configuration in conjunction with CCs operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communications system 100 may use a transmission scheme between a transmitting device (e.g., a base station 105) and a receiving device (e.g., a UE 115), where the transmitting device is equipped with multiple antennas and the receiving devices are equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream, and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use hybrid automatic repeat request (HARQ) to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical (PHY) layer, transport channels may be mapped to physical channels.

In some cases, UEs 115 and base stations 105 may support retransmissions of data to increase the likelihood that data is received successfully. HARQ feedback is one technique of increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

The term "carrier" refers to a set of radio frequency spectrum resources having a defined physical layer structure for supporting communications over a communication link 125. For example, a carrier of a communication link 125 may include a portion of a radio frequency spectrum band that is operated according to physical layer channels for a given radio access technology. Each physical layer channel may carry user data, control information, or other signaling. A carrier may be associated with a pre-defined frequency channel (e.g., an E-UTRA absolute radio frequency channel number (EARFCN)), and may be positioned according to a channel raster for discovery by UEs 115. Carriers may be downlink or uplink (e.g., in an FDD mode), or be configured to carry downlink and uplink communications (e.g., in a TDD mode). In some examples, signal waveforms transmitted over a carrier may be made up of multiple sub-carriers (e.g., using multi-carrier modulation (MCM) techniques such as OFDM or DFT-s-OFDM).

The organizational structure of the carriers may be different for different radio access technologies (e.g., LTE, LTE-A, LTE-A Pro, NR, etc.). For example, communications over a carrier may be organized according to TTIs or slots, each of which may include user data as well as control information or signaling to support decoding the user data. A carrier may also include dedicated acquisition signaling (e.g., synchronization signals or system information, etc.) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

Wireless communications system 100 may support the concurrent transmissions of multiple transmitters through the use of various NOMA techniques. For example, a MUD at a base station 105 may use SIC to decode NOMA transmissions from multiple UEs 115 that are concurrently transmitted using common resources. Further, when transmitting a data stream, a UE 115 may apply different RSMA techniques to enhance reception at the base station 105. UEs 115 may in some cases transmit an uplink DMRS that may be used at a base station 105 to measure channel characteristics and perform channel estimation to aid in the demodulation and decoding of other uplink transmissions from a particular UE 115. In some cases, different UEs 115 may use different DMRS sequences, which may allow a base station 105 to decode DMRS transmissions for each UE 115. In some cases, the sequences used for the DMRS transmissions may be formed by concatenating a number of short sequences in the time domain, where each short sequence is applied to frequency domain resources. In some cases, the DMRS sequences may be formed by identifying, based at least in part on a size of configured reference signal resources, a square matrix having mutually orthogonal rows (e.g., a Hadamard matrix) partitioning the square matrix to identify a prototype sequence, and segmenting the prototype sequence to determine the DMRS sequence. A base statin 105 that receives a number of concurrently transmitted DMRS transmissions over common resources may demodulate and decode the different DMRS transmissions based on the different reference signal sequences, and perform channel estimation for each of the UEs 115.

Figure 2:
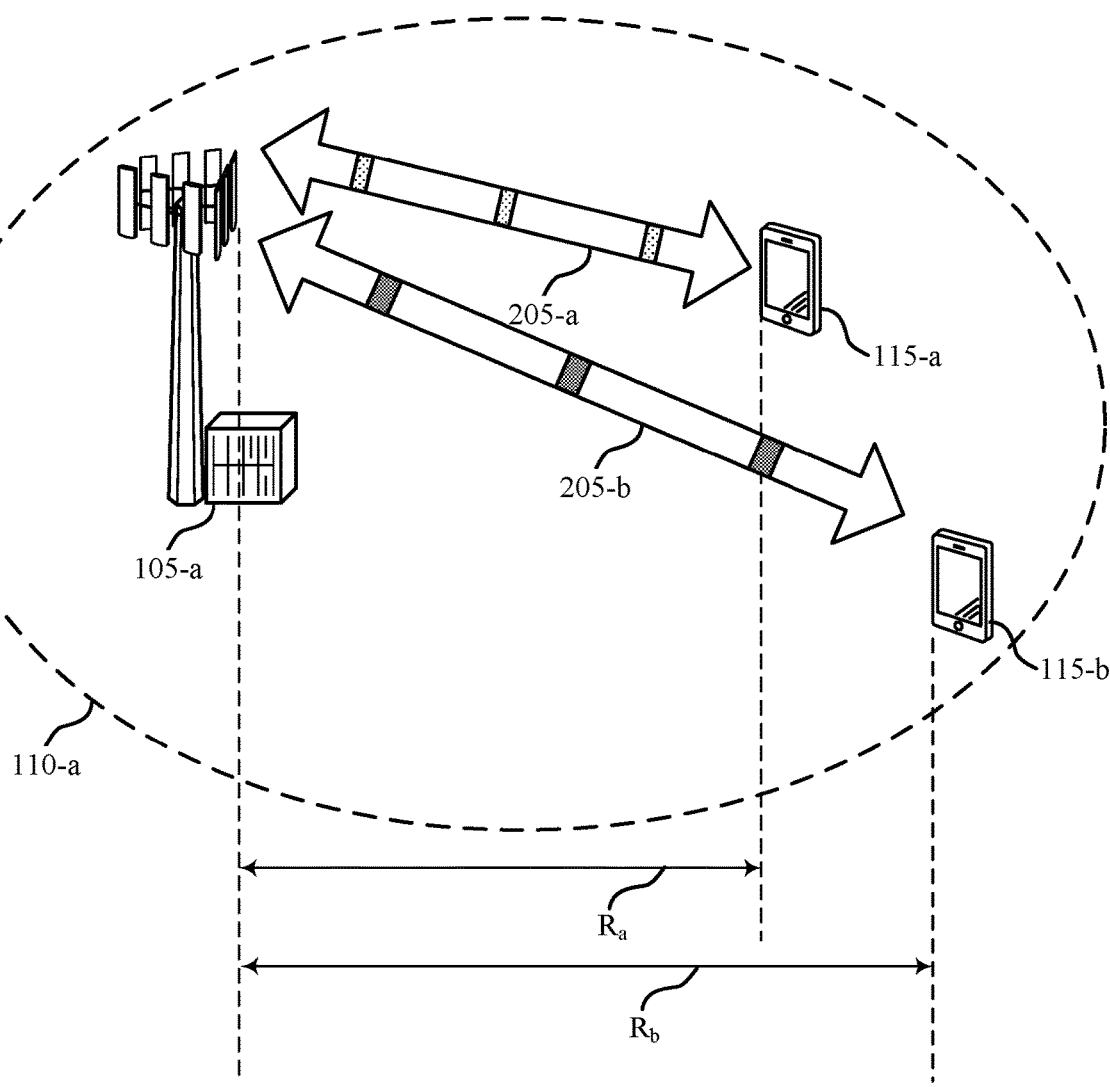
FIG. 2 illustrates an example of a portion of a wireless communication system that supports reference signal transmission techniques for NOMA wireless communications in accordance with aspects of the present disclosure.

FIG. 2 illustrates an example of a portion of a wireless communication system 200 that supports reference signal transmission techniques for NOMA wireless communications in accordance with various aspects of the present disclosure. In the example of FIG. 2, the wireless communication system 200 may include a base station 105-a, which may be an example of a base station 105 of FIG. 1. The wireless communication system 200 may also include a first UE 115-a and a second UE 115-b, which may be examples of a UE 115 of FIG. 1, that are located within coverage area 110-a of the base station 105-a.

In the example of FIG. 2, the base station 105-a and the first UE 115-a may establish a first connection 205-a and the base station 105-a and the second UE 115-b may establish a second connection 205-b. In some cases, each of the first UE 115-a and the second UE 115-b may concurrently transmit uplink transmissions via their respective connections 205 in accordance with NOMA techniques. As discussed above, NOMA techniques may help to enhance the achievable spectral efficiency (SE) of the wireless communication system 200. In some cases, the base station 105-a may include a SIC/MUD receiver that may receive and decode concurrently transmitted signals transmitted from the first UE 115-a and the second UE 115-b. In various aspects of the present disclosure, the UEs 115 may transmit reference signals, such as DMRS transmissions 210 of the first UE 115-*a* and DMRS transmissions 215 of the second UE 115-*b*, which may be used at the base station 105-*a* for channel estimation of each the first connection 205-*a* and second connection 205-*b*, respectively. In some cases, the DMRS transmissions 210-215 may include reference signal sequences, as will be discussed in more detail in FIGS. 3 through 6.

In some cases, DMRS transmissions of the UEs 115 may use common reference signal resources that are configured by the base station 105-*a*, but the first UE 115-*a* DMRS transmissions 210 may not be completely synchronized with the second UE 115-*b* DMRS transmissions 215, which may be caused in part due to different distances between the UEs 115 and the base station 105-*a*. For example, the first UE 115-*a* may be located a first distance $R_a$ from the base station 105-*a*, and the second UE 115-*b* may be located a second distance $R_b$ from the base station 105-*a*. Thus, different propagation delays may result in some loss of synchronization. In some cases, DMRS sequences may be designed to allow for robust channel estimation even in the case of asynchronous DMRS transmission within a bounded timing offset (e.g., a bounded timing offset associated with a maximum radius of the coverage area 110-*a*) or quasi-synchronous DMRS transmissions (e.g., maintained by use of timing advance (TA) techniques). In such cases, DMRS sequences from the different UEs 115 may be selected such that cross-correlation of time-offset sequences is at or below a threshold value. Such DMRS sequences may maintain a low correlation zone (LCZ) or zero correlation zone (ZCZ) to enhance reliable channel estimation for the UEs 115, as will be discussed in more detail with respect to FIG. 3.

Figure 3:
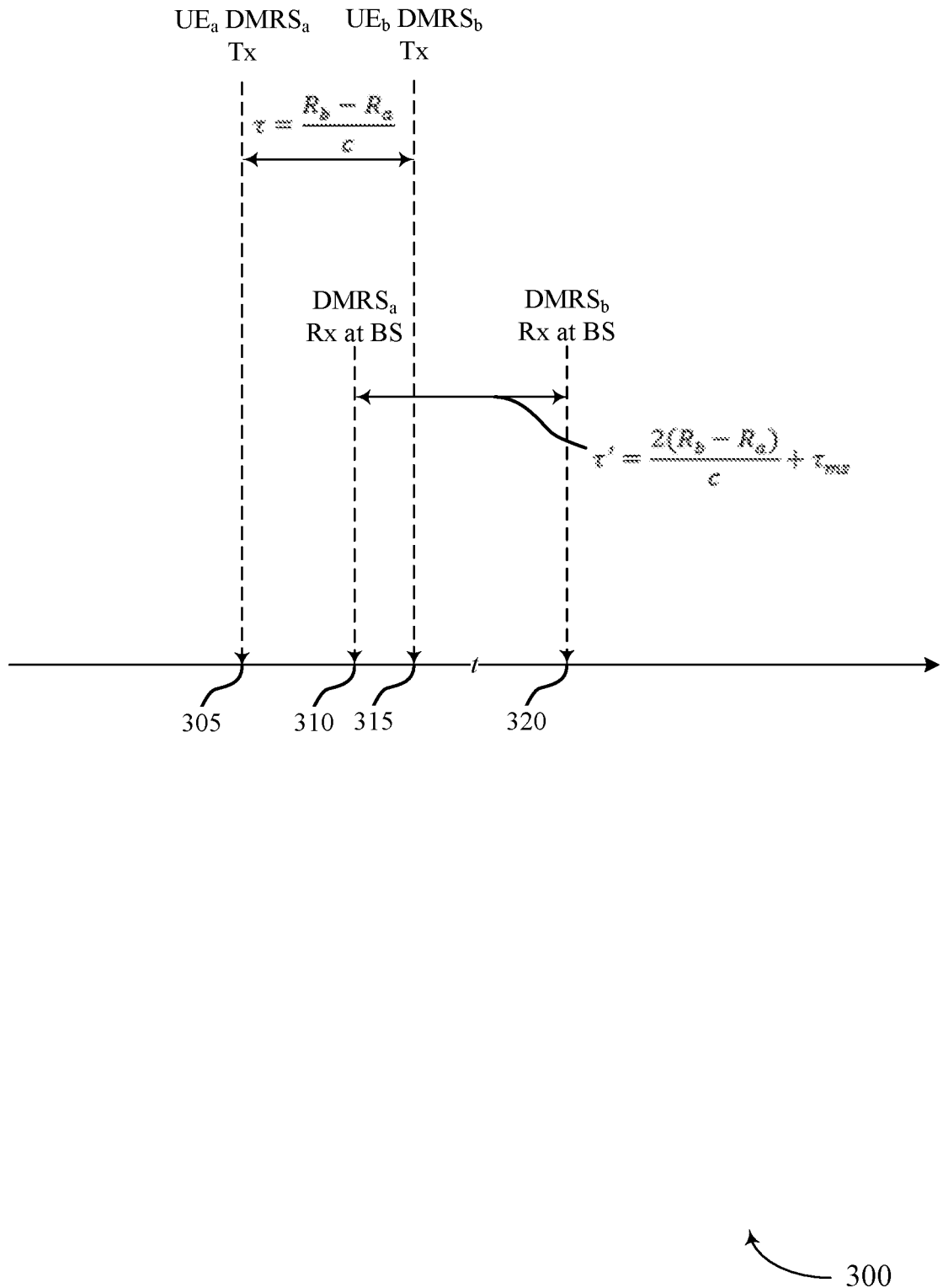
FIG. 3 illustrates an example of a timing diagram of reference signal transmissions that supports reference signal transmission techniques for NOMA wireless communications in accordance with aspects of the present disclosure.

FIG. 3 illustrates an example of a timing diagram of reference signal transmissions 300 that supports reference signal transmission techniques for NOMA wireless communications in accordance with various aspects of the present disclosure. In some examples, timing diagram of reference signal transmissions 300 may implement aspects of wireless communication system 100. As discussed above, in some cases, a first UE (e.g., UE 115-*a* of FIG. 2) may be located a first distance $R_a$ from a base station (e.g., base station 105-*a* of FIG. 2), and a second UE (e.g., UE 115-*b* of FIG. 2) may be located a second distance $R_b$ from the base station, which may have a cell radius (r).

In such cases, the UEs may transmit DMRS transmissions at a particular time relative to receiving, for example, a pilot signal from the base station, such that the first UE ($UE_a$) may transmit a first DMRS ($DMRS_a$) at a first time 305, and the second UE ($UE_b$) may transmit a second DMRS ($DMRS_b$) at a second time 310. In this case, a delay spread $\tau$ of the DMRS transmissions may be computed as:

$$\tau = \frac{R_b - R_a}{c}$$

in which c is the speed of light. Additionally, a delay spread $\tau'$ for DMRS reception at the base station may be described, where $DMRS_a$ reaches the base station at third time 315 and $DMRS_b$ reaches the base station at fourth time 320, as:

$$\tau' = \frac{2(R_b - R_a)}{c} + \tau_{ms}$$

where $\tau_{ms}$ is a maximum of delay spread $\tau$ that may be present in the system. In some cases, a low correlation zone (LCZ) of size $T_Z$ may be identified based on the potential delay spreads over which DMRS transmissions should have a cross-correlation that is upper bounded by a threshold δ. In such cases, a base station that receives multiple time-offset DMRS sequences may still be able to perform channel estimation due to the relatively low (or no) cross-correlation between the DMRS sequences at the time offset. For example, within the LCZ of size $T_Z$, for two arbitrarily chosen DMRS sequences $\{A(n)\}$ and $\{B(n)\}$, the magnitude of cross-correlation is upper bounded by a threshold δ, i.e.

$$T_Z \triangleq \max_{\tau}\left\{\tau : \left|\sum_{n=0}^{N-1} A(n)B^*(n+\tau)\right| \leq \delta\right\}.$$

In some cases, a zero correlation zone (ZCZ) may be identified, in which the threshold δ is set to zero. Various aspects of the present disclosure provide techniques for generating LCZ and ZCZ sequences, that provide sufficient different sequences for a relatively large number of NOMA transmitters to transmit concurrent DMRS transmissions that may be used at the base station for channel estimation. In some cases, the numerology of DMRS symbol(s) used for DMRS transmissions may be set according to NR configurations, in which sub-carrier spacing (SCS) of the DMRS symbol(s) is an integer multiple or a fraction of data symbol SCS, a cyclic prefix (CP) length may correspond to a normal or extended CP, an effective bandwidth of the DMRS symbol(s) is the same as for data symbols, a DMRS transmission may span one or multiple consecutive OFDM symbols, or any combination thereof. Some examples of DMRS sequence generation that provide LCZ and ZCZ sequences are discussed with respect to FIGS. 4 and 5.

Figure 4:
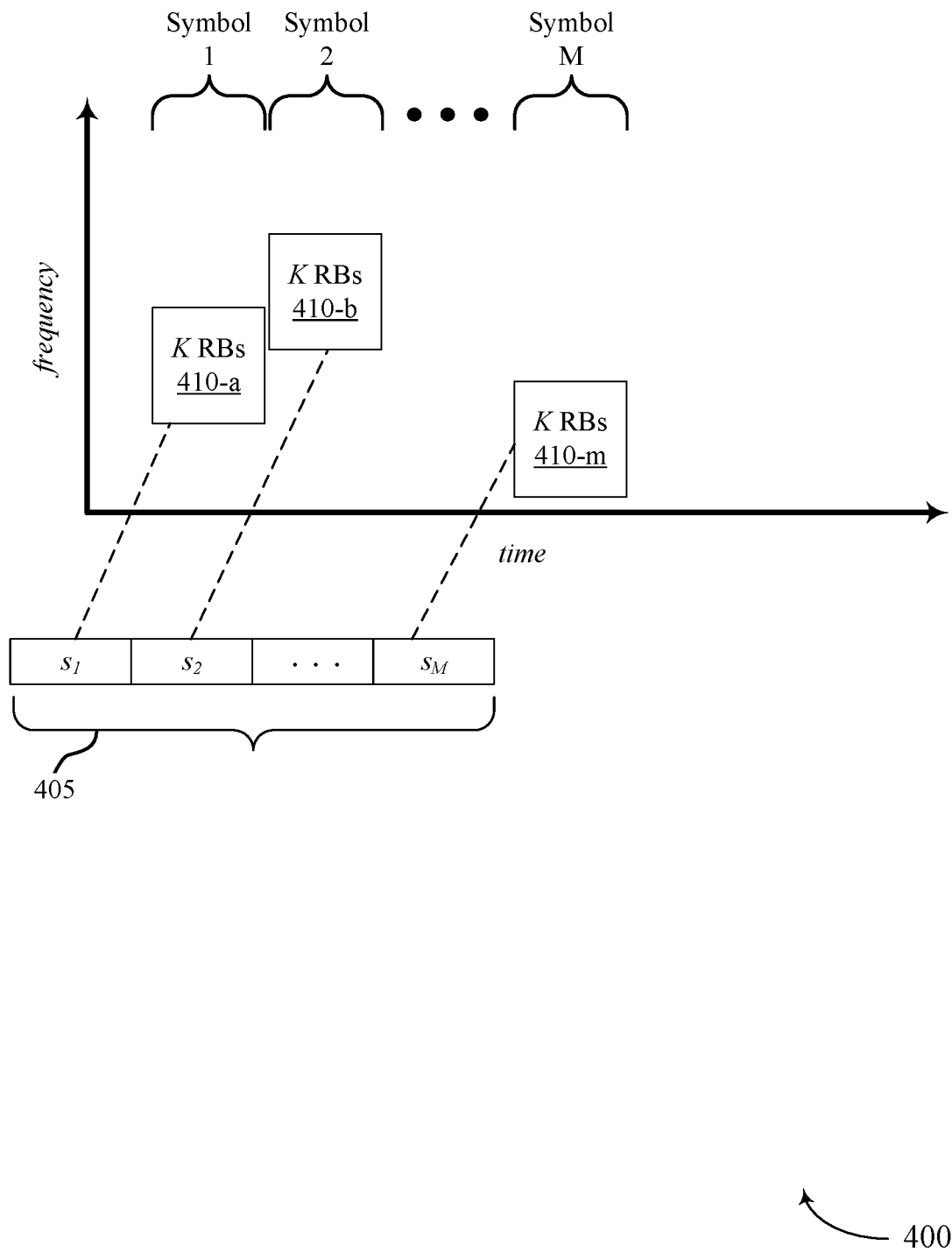
FIG. 4 illustrates an example of a reference signal sequence generation that supports reference signal transmission techniques for NOMA wireless communications in accordance with aspects of the present disclosure.

FIG. 4 illustrates an example of a reference signal sequence generation 400 that supports reference signal transmission techniques for NOMA wireless communications in accordance with various aspects of the present disclosure. In some examples, reference signal sequence generation 400 may implement aspects of wireless communication system 100. In this example, a number of OFDM symbols, symbol 1 through symbol M, may be configured for DMRS transmissions, in which the DMRS resources may be configured to include time resources and frequency resources within each of the OFDM symbols. In this example, a number of short sequences ($S_n$) may be concatenated to form a DMRS sequence 405 that is used for a DMRS transmission. In this case, a first short sequence $S_1$ may be applied to frequency resources in K RBs 410-*a* of OFDM symbol 1, a second short sequence $S_2$ may be applied to frequency resources in K RBs 410-*b* of OFDM symbol 2, and so on with an $M^{th}$ short sequence $S_M$ be applied to frequency resources in K RBs 410-*m* of OFDM symbol M.

In some cases, each of the short sequences $S_n$ may occupy K RBs in the frequency domain, and the short sequences may be selected from a codebook of available short sequences (e.g., based on a UE identification that may be indexed into the codebook). In some cases, UEs and a base station may be configured with a number of codebooks of sequences, and a particular codebook may be selected based on the configured DMRS resources (e.g., the configured frequency resources and time resources). In some cases, each short sequence of each codebook of available short sequences has a root index and cyclic shift that provides a cross-correlation with other available short sequences of the codebook that is below a threshold value. In some cases, the short sequences may include constant-amplitude zero-autocorrelation (CAZAC) sequences, pseudo-random noise (PN) sequences, Kasami sequences, Golay sequences, or any combination thereof. In some cases, the available codebooks of short sequences may have configured combinations of root index and cyclic shift to provide large enough ZCZ and LCZ for a given cell radius and multipath delay spread, and also provide a sufficiently large number of distinct combinations to reduce the probability of collision and allow a number of different NOMA UEs to transmit DMRS concurrently. In some cases, the synthesis of root index and cyclic shift for sequences within a codebook may be formed by constructing shift sequences in frequency domain and interleaving in the time domain. In other cases, the synthesis of root index and cyclic shift for sequences within a codebook may be formed by following coding constraints of short linear block codes (e.g., Reed Solomon codes, BCH codes, Reed Muller codes, Hamming codes, etc.), which may thus provide an error correcting code such that if one of the short sequences is lost (e.g., due to interference or fading), it may be recovered at the receiver.

Figure 5:
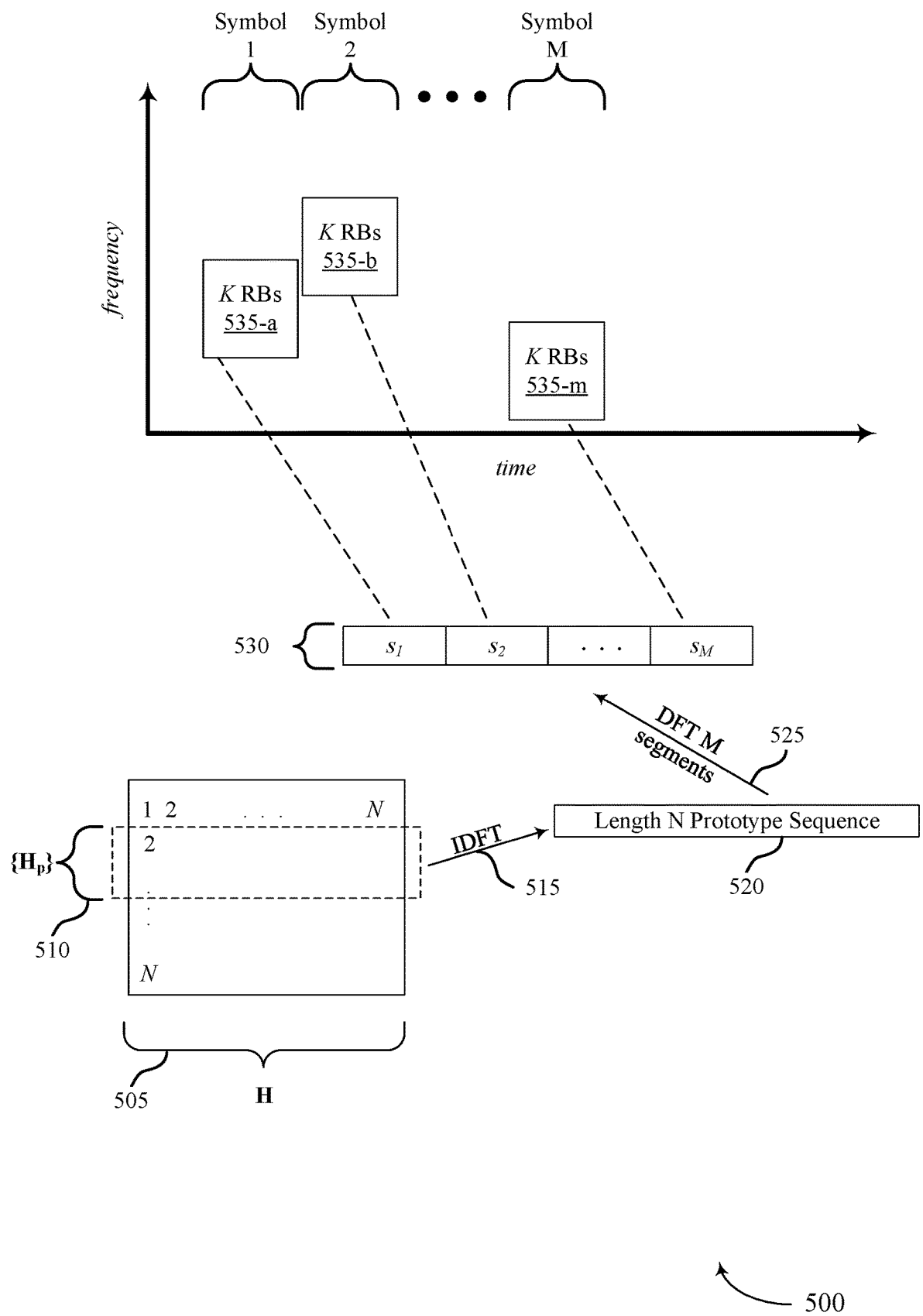
FIG. 5 illustrates an example of a reference signal sequence generation that supports reference signal transmission techniques for NOMA wireless communications in accordance with aspects of the present disclosure.

FIG. 5 illustrates an example of a reference signal sequence generation 500 that supports reference signal transmission techniques for NOMA wireless communications in accordance with various aspects of the present disclosure. In some examples, reference signal sequence generation 500 may implement aspects of wireless communication system 100. In this example, a number of OFDM symbols, symbol 1 through symbol M, may be configured for DMRS transmissions, in which the DMRS resources may be configured to include time resources and frequency resources within each of the OFDM symbols. In this example, a number of short sequences ($S_n$) may be derived based on a nested partition of a square matrix of sequences having mutually orthogonal rows (e.g., a Hadamard matrix).

In the example of FIG. 5, a Hadamard matrix (H) 505 may be configured at each of the UEs and at the base station, which is a square (N×N) matrix of sequences having orthogonal rows. In some cases, the value of N may be the product of a number of resource blocks (K) of configured DMRS frequency resources, a number of OFDM symbols (M) of configured DMRS time resources, and a number of resource elements (REs) within each RM (e.g., 12). The Hadamard matrix 505 may be partitioned into P different submatrices $H_p$ 510 having Q rows, where Q is determined based on the size of the LCZ or ZCZ, and Q=N/P. For each row of $H_p$ 510 an inverse discrete Fourier transform (IDFT) 515 may be performed to generate Q prototype sequences (which according to properties of the Hadamard matrix have a ZCZ size of P−1). In some cases, within each submatrix $H_p$ 510, further nested partitions may be performed to obtain prototype sequences with a larger ZCZ. In some cases, the length of ZCZ can be estimated by UE (e.g., based on a measured distance from the base station), or configured by the base station before NOMA transmissions (e.g., via RRC configuration, SS block information, etc.). UEs at different cell radii can thus use prototype sequences of different ZCZ sizes.

Each UE may select one length N prototype sequence 520 from the prototype sequences (e.g., based on a UE identification), and may uniformly segment it into M sub-sequences, in which the size of each sub-sequence is N/M. The UE may then take a discrete Fourier transform (DFT) 525 of each sub-sequence to generate a series of sub-sequences $S_n$ 530, which may then be mapped to corresponding frequency resources 535 (e.g., to K RBs) within the OFDM symbols one through M corresponding to the configured time resources for DMRS. A base station receiving the DMRS sequences may decode the received sequences and perform channel estimation.

Figure 6:
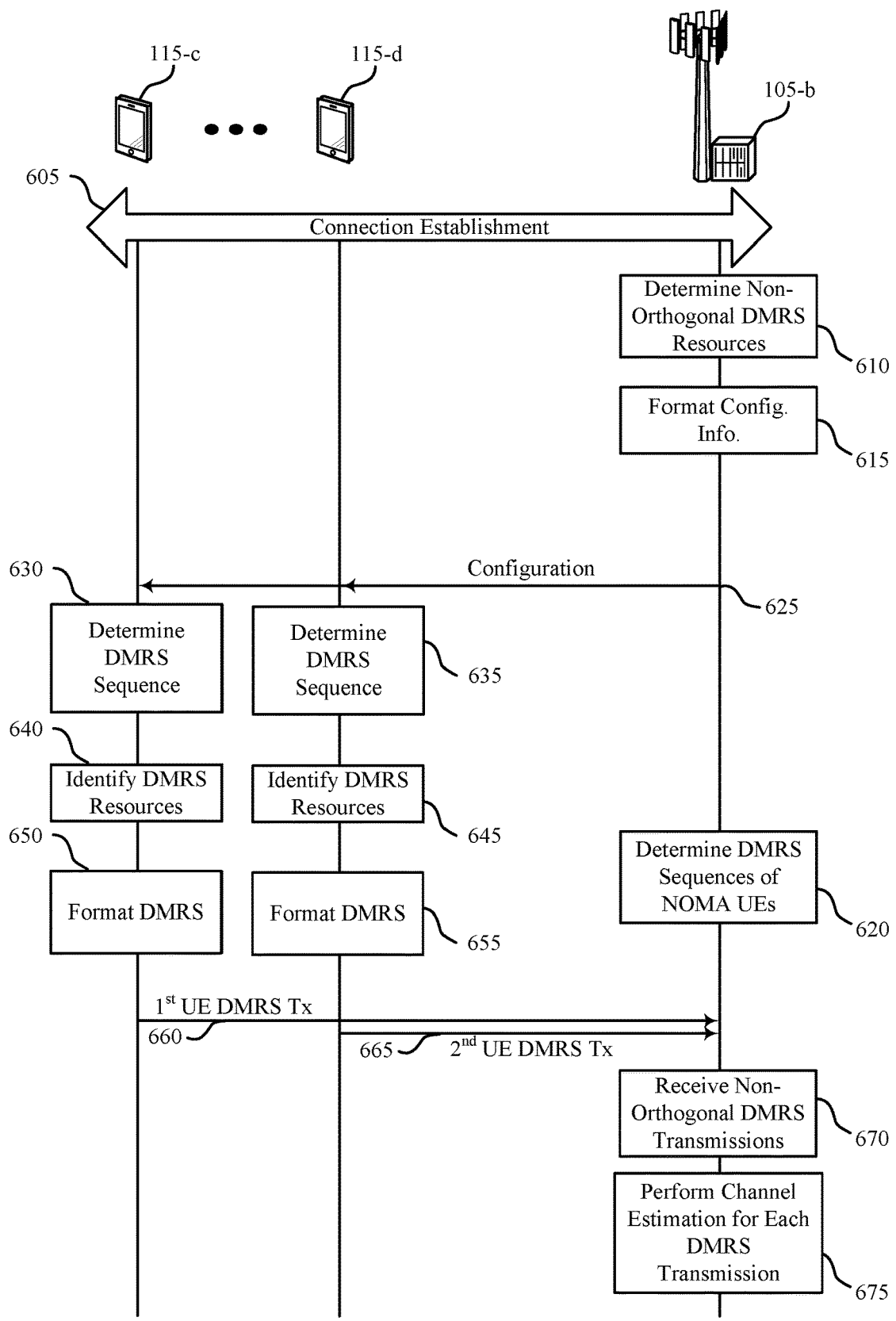
FIG. 6 illustrates an example of a process flow that supports reference signal transmission techniques for NOMA wireless communications in accordance with aspects of the present disclosure.

FIG. 6 illustrates an example of a process flow 600 that supports reference signal transmission techniques for NOMA wireless communications in accordance with various aspects of the present disclosure. In some examples, process flow 600 may be implemented in aspects of wireless communication system 100 or 200. Process flow 600 may include a base station 105-b, a first UE 115-c, and a second UE 115-d. The base station 105-b may be an example of a base station 105 of FIG. 1 or 2, and the UEs 115 may be examples of UEs 115 of FIG. 1 or 2. Initially, the base station 105-b may perform a connection establishment 605 according to established connection establishment techniques. In some cases, the base station 105-b may configure the UEs 115 for NOMA transmissions as part of a NOMA transmission group.

At 610, the base station 105-b may determine non-orthogonal DMRS resources for a number of NOMA transmitters that may transmit in a NOMA transmitter group. In some cases, the number of NOMA transmitters may be determined based on a number of UEs 115 that are to be served, a number of available resources for transmissions, a target overloading factor, or any combination thereof, and the non-orthogonal DMRS resources may be determined based on the number of NOMA transmitters.

At 615, the base station 105-b may format configuration information, which may include configuration information for the non-orthogonal DMRS resources and transmit the configuration information 625 to the UEs 115. In some cases, the configuration information 625 may be transmitted in RRC signaling. In some cases, the configuration information 625 may be transmitted in a system information block (SIB) or an a synchronization signal block (SS block) that is transmitted to the UEs 115. The DMRS resources may be allocated in one or more dimensions, including time, frequency, or space dimensions, or any combination thereof. In some cases, the allocated DMRS resources may include a number of OFDM symbols and RBs, and the number and configuration of resources may be used, to identify a codebook of DMRS sequences. The number and configuration of resources may be used, in some cases, as an index into available codebooks of DMRS sequences.

At 630, the first UE 115-c may determine a DMRS sequence for an uplink non-orthogonal DMRS transmission. Similarly, at 635, the second UE 115-d may determine a DMRS sequence for an uplink non-orthogonal DMRS transmission. The DMRS sequences may be determined as discussed above, and may include a number of short sequences that are applied to frequency resource and that are mapped to time resources. In some cases, a particular codebook may be identified based on a number and configuration of the allocated non-orthogonal DMRS resources, and a particular DMRS sequence at each UE 115 may be determined based on an index into the codebook for the particular UE 115.

At 640, the first UE 115-c may identify uplink DMRS resources for DMRS transmission. Similarly, at 645, the second UE 115-d may identify uplink DMRS resources for DMRS transmission. The uplink DMRS resource may be identified based on the configuration information 625 provided by the base station 105-b, for example.

At 650, the first UE 115-c may format its DMRS by identifying short sequences and mapping the sequences to the DMRS resources, as discussed above. Similarly, at 655, the second UE 115-d may format its DMRS by identifying short sequences and mapping the sequences to the DMRS resources, as also discussed above. In the example of FIG. 6, the first UE 115-c may transmit a first UE DMRS transmission 660 using the same allocated DMRS uplink resources as the second UE 115-d for transmission of a second UE DMRS transmission 665.

At 620, the base station 105-b may determine DMRS sequences of the NOMA UEs 115. The base station 105-b may determine that DMRS sequences based on a codebook of available sequences that may be identified based on the configured DMRS resources. In some cases, DMRS sequences within the codebook may be identified based on the UEs 115 that are configured for transmission using the DMRS resources.

At 670, the base station 105-b may receive the DMRS transmissions. As discussed above, when receiving NOMA transmissions, the base station 105-b may perform NOMA processing, such as SIC/RMSA processing at a MUD to identity a number of separate NOMA transmissions. At 675, the base station 105-b may perform channel estimation for each DMRS transmission.

Figure 7:
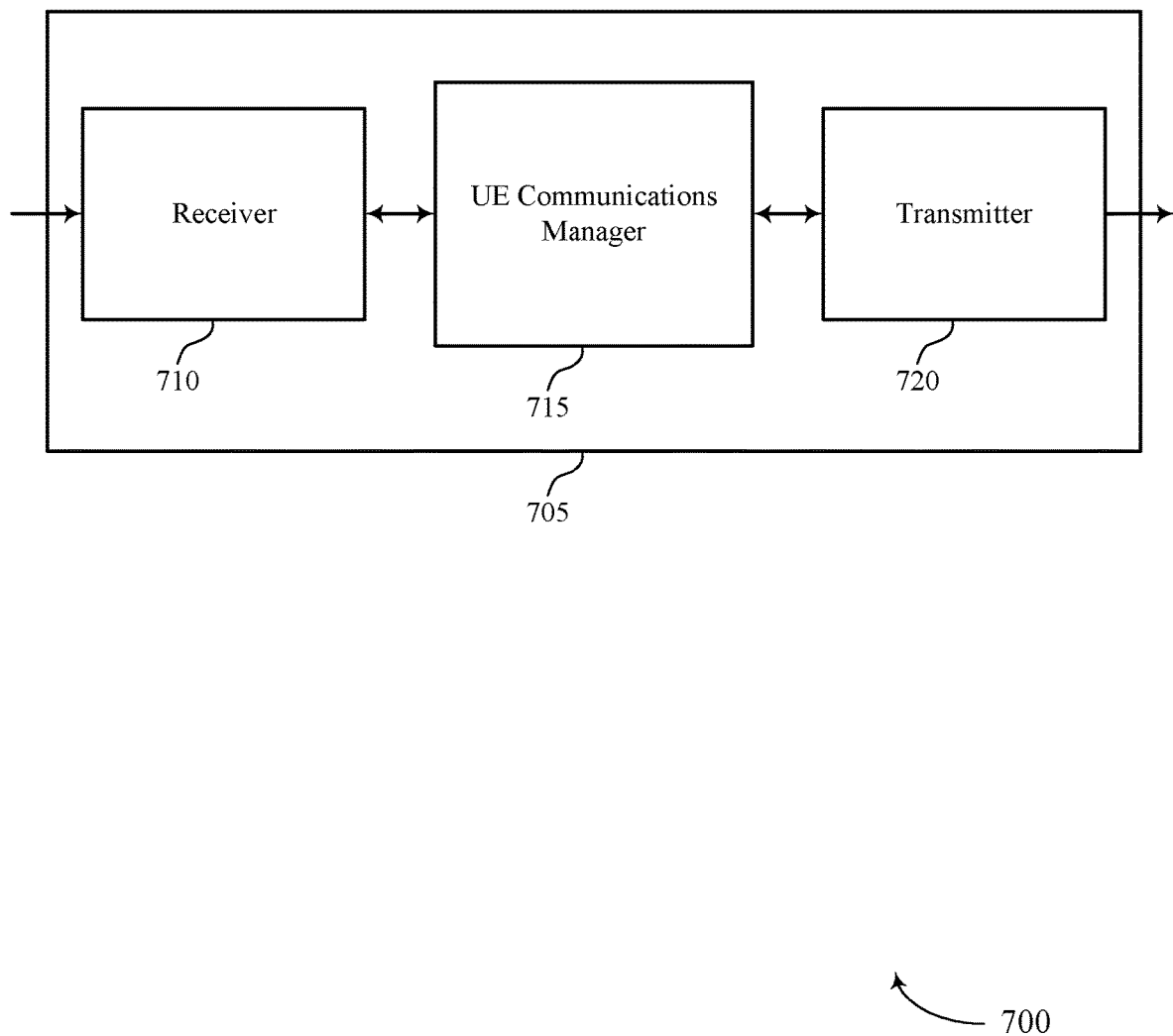
FIGS. 7 through 9 show block diagrams of a device that supports reference signal transmission techniques for NOMA wireless communications in accordance with aspects of the present disclosure.

FIG. 7 shows a block diagram 700 of a wireless device 705 that supports reference signal transmission techniques for NOMA wireless communications in accordance with aspects of the present disclosure. Wireless device 705 may be an example of aspects of a UE 115 as described herein. Wireless device 705 may include receiver 710, UE communications manager 715, and transmitter 720. Wireless device 705 may also include a processor. Each of these components may be in communication with one another (e.g., via one or more buses).

Receiver 710 may receive information such as packets, user data, or control information associated with various information channels (e.g., control channels, data channels, and information related to reference signal transmission techniques for NOMA wireless communications, etc.). Information may be passed on to other components of the device. The receiver 710 may be an example of aspects of the transceiver 1035 described with reference to FIG. 10. The receiver 710 may utilize a single antenna or a set of antennas.

UE communications manager 715 may be an example of aspects of the UE communications manager 1015 described with reference to FIG. 10.

UE communications manager 715 and/or at least some of its various sub-components may be implemented in hardware, software executed by a processor, firmware, or any combination thereof. If implemented in software executed by a processor, the functions of the UE communications manager 715 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The UE communications manager 715 and/or at least some of its various sub-components may be physically located at various positions, including being distributed such that portions of functions are implemented at different physical locations by one or more physical devices. In some examples, UE communications manager 715 and/or at least some of its various sub-components may be a separate and distinct component in accordance with various aspects of the present disclosure. In other examples, UE communications manager 715 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

UE communications manager 715 may receive, from a base station (or another wireless communication device), an indication of a set of resources for transmission of a reference signal, where a set of NOMA transmitters are configured for at least partially concurrent transmissions using the set of resources, identify, based on the set of resources, a plurality of short sequences to be included in the reference signal, each short sequence of the plurality of short sequences having a root index and cyclic shift that provides a cross-correlation with other of the plurality of short sequences that is below a threshold value, concatenate the plurality of short sequences to generate a reference signal sequence for the reference signal, and transmit the reference signal to the base station.

The UE communications manager 715 may also receive, from a base station (or another wireless communication device), an indication of a set of resources for transmission of a reference signal, the set of resources including a first subset of frequency resources and a second subset of time resources, and where a set of NOMA transmitters are configured for at least partially concurrent transmissions using the set of resources, identify, based on a size of the first subset of frequency resources and the second subset of time resources, a square matrix having mutually orthogonal rows, select a first submatrix of the square matrix based on a distance to the base station, segment the first submatrix into a number of short sequences to be included in the reference signal, each short sequence of the number of short sequences having a length that corresponds to the first subset of frequency resources and the number of short sequences corresponding to a number of time resources within the second subset of time resources, and transmit the reference signal to the base station using the set of resources.

Transmitter 720 may transmit signals generated by other components of the device. In some examples, the transmitter 720 may be collocated with a receiver 710 in a transceiver module. For example, the transmitter 720 may be an example of aspects of the transceiver 1035 described with reference to FIG. 10. The transmitter 720 may utilize a single antenna or a set of antennas.

Figure 8:
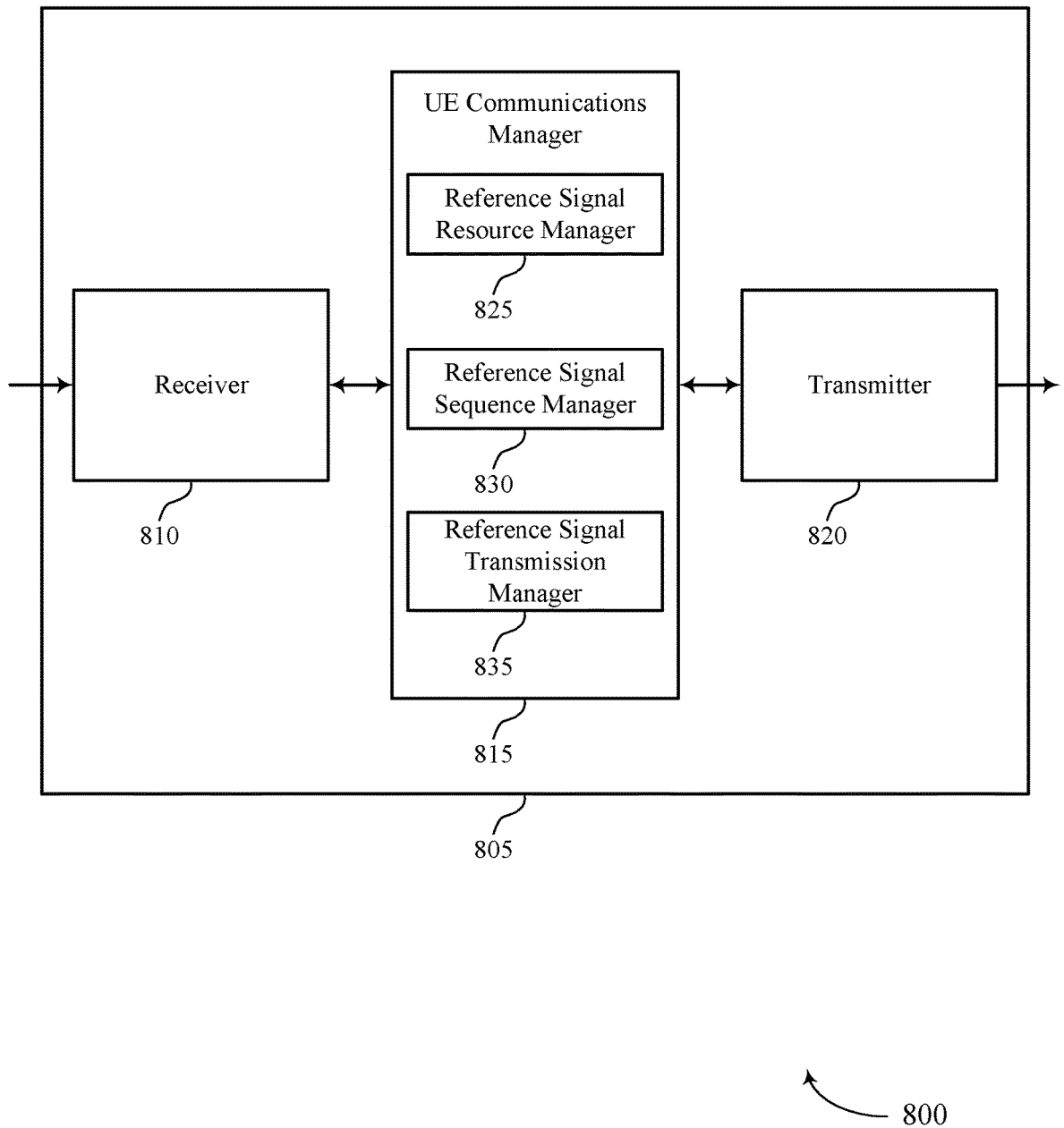

FIG. 8 shows a block diagram 800 of a wireless device 805 that supports reference signal transmission techniques for NOMA wireless communications in accordance with aspects of the present disclosure. Wireless device 805 may be an example of aspects of a wireless device 705 or a UE 115 as described with reference to FIG. 7. Wireless device 805 may include receiver 810, UE communications manager 815, and transmitter 820. Wireless device 805 may also include a processor. Each of these components may be in communication with one another (e.g., via one or more buses).

Receiver 810 may receive information such as packets, user data, or control information associated with various information channels (e.g., control channels, data channels, and information related to reference signal transmission techniques for NOMA wireless communications, etc.). Information may be passed on to other components of the device. The receiver 810 may be an example of aspects of the transceiver 1035 described with reference to FIG. 10. The receiver 810 may utilize a single antenna or a set of antennas.

UE communications manager 815 may be an example of aspects of the UE communications manager 1015 described with reference to FIG. 10. UE communications manager 815 may also include reference signal resource manager 825, reference signal sequence manager 830, and reference signal transmission manager 835.

Reference signal resource manager 825 may receive, from a base station (or another wireless communication device), an indication of a set of resources for transmission of a reference signal, where a set of NOMA transmitters are configured for at least partially concurrent transmissions using the set of resources, the set of resources including a first subset of frequency resources and a second subset of time resources. In some cases, reference signal resource manager 825 may receive a reference signal length indication from the base station that may be used for partitioning a matrix of sequences. In some cases, the reference signal sequence allows for asynchronous reference signal transmissions from multiple transmitters. In some cases, the receiving the indication of the set of resources includes receiving RRC signaling, a synchronization signal block, a broadcast signal, a system information block, or any combination thereof.

Reference signal sequence manager 830 may identify, based on the set of resources, a plurality of short sequences to be included in the reference signal. In some cases, each short sequence of the plurality of short sequences may have a root index and cyclic shift that provides a cross-correlation with other of the plurality of short sequences that is below a threshold value. In some cases, reference signal sequence manager 830 may concatenate the plurality of short sequences to generate a reference signal sequence for the reference signal. In some cases, reference signal sequence manager 830 may identify, based on a size of a first subset of frequency resources and a second subset of time resources, a square matrix having mutually orthogonal rows, select a first submatrix of the square matrix based on a distance to the base station, and segment the first submatrix into a number of short sequences to be included in the reference signal, each short sequence of the number of short sequences having a length that corresponds to the first subset of frequency resources and the number of short sequences corresponding to a number of time resources within the second subset of time resources. In some cases, reference signal sequence manager 830 may perform, for each row of a subset of rows in the submatrix, an IDFT to generate a set of prototype sequences, and may perform, on each prototype sequence, a DFT to generate a frequency-domain sub-sequence.

In some cases, the identifying the plurality of short sequences includes determining the root index and cyclic shift for each short sequence within a set of frequency domain resources. In some cases, the selecting the first submatrix includes selecting a subset of rows of the square matrix. In some cases, the segmenting the first submatrix into the number of short sequences includes identifying a number of symbols within the second subset of time resources, and segmenting the set of prototype sequences into a set of sub-sequences based on the number of symbols. In some cases, the set of resources include frequency resources and time resources, and where a first short sequence of the plurality of short sequences is applied to a first subset of the frequency resources that are located within a first subset of the time resources, and a second short sequence of the plurality of short sequences is applied to a second subset of the frequency resources that are located within a second subset of the time resources. In some cases, the plurality of short sequences each include a portion of a linear block code that can be successfully decoded if an error in receiving one or more portions of the linear block code occurs. In some cases, the linear block code is an error-correcting code. In some cases, the square matrix is a Hadamard matrix having a size that is based on the first subset of frequency resources and the second subset of time resources. In some cases, the error-correcting code includes a Reed Solomon code, a BCH code, a Reed Muller code, a Hamming code, or other error-connecting code. In some cases, the threshold value is based on a one or more of a cell radius of the base station, a multipath delay spread associated with the base station, or any combination thereof. In some cases, each short sequence of the plurality of short sequences is a CAZAC sequence, a PN sequence, a Kasami sequence, or a Golay sequence.

Reference signal transmission manager 835 may transmit the reference signal to the base station using the set of resources.

Transmitter 820 may transmit signals generated by other components of the device. In some examples, the transmitter 820 may be collocated with a receiver 810 in a transceiver module. For example, the transmitter 820 may be an example of aspects of the transceiver 1035 described with reference to FIG. 10. The transmitter 820 may utilize a single antenna or a set of antennas.

Figure 9:
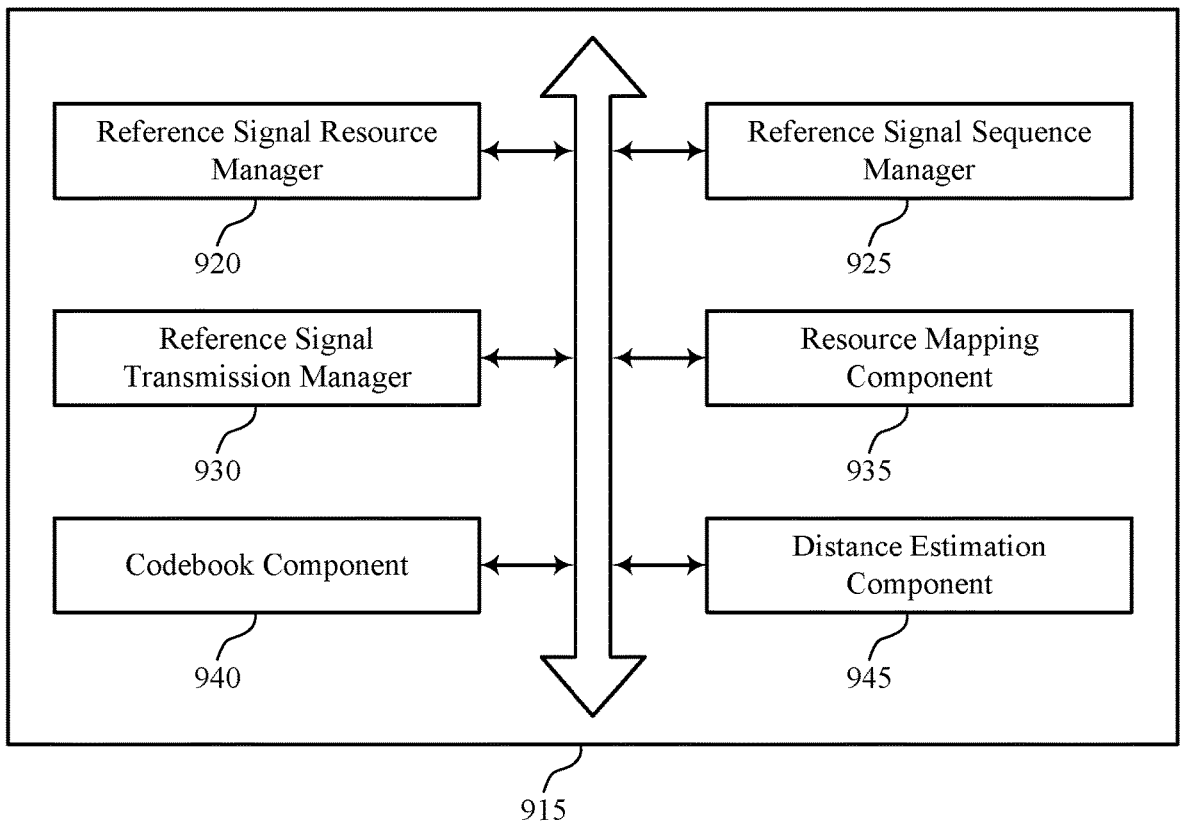

FIG. 9 shows a block diagram 900 of a UE communications manager 915 that supports reference signal transmission techniques for NOMA wireless communications in accordance with aspects of the present disclosure. The UE communications manager 915 may be an example of aspects of a UE communications manager 715, a UE communications manager 815, or a UE communications manager 1015 described with reference to FIGS. 7, 8, and 10. The UE communications manager 915 may include reference signal resource manager 920, reference signal sequence manager 925, reference signal transmission manager 930, resource mapping component 935, codebook component 940, and distance estimation component 945. Each of these modules may communicate, directly or indirectly, with one another (e.g., via one or more buses).

Reference signal resource manager 920 may receive, from a base station (or another wireless communication device), an indication of a set of resources for transmission of a reference signal, where a set of NOMA transmitters are configured for at least partially concurrent transmissions using the set of resources, the set of resources including a first subset of frequency resources and a second subset of time resources. In some cases, reference signal resource manager 920 may receive a reference signal length indication from the base station that may be used for partitioning a matrix of sequences. In some cases, the reference signal sequence allows for asynchronous reference signal transmissions from multiple transmitters. In some cases, the receiving the indication of the set of resources includes receiving RRC signaling, a synchronization signal block, a broadcast signal, a system information block, or any combination thereof.

Reference signal sequence manager 925 may identify, based on the set of resources, a plurality of short sequences to be included in the reference signal. In some cases, the meaning of "short" in each short sequence refers to the total resource blocks used for data transmission for which the reference signal may be used to provide channel estimation and coherent demodulation. For example, in some DMRS implementations, a bandwidth of a reference signal sequence used for a DMRS may be a same bandwidth as the bandwidth for the corresponding data transmission. In some cases, each of the short sequences to be included in the reference signal sequence may have a bandwidth that is less than a bandwidth of the corresponding data transmission.

In some cases, each short sequence of the plurality of short sequences may have a root index and cyclic shift that provides a cross-correlation with other of the plurality of short sequences that is below a threshold value. In some cases, at least one short sequence of the plurality of short sequences comprises a root index that is a same root index as a root index of another short sequence of the plurality of short sequences. For example, a first short sequence may have a same root index as a second short sequence, and the first short sequence may have a different cyclic shift than the second short sequence. In such cases, the second short sequence may be orthogonal to the first short sequence. In some cases, at least one short sequence of the plurality of short sequences comprises a cyclic shift that is a same cyclic shift as a cyclic shift of another short sequence of the plurality of short sequences. For, example, the first short sequence may have a root index different from a root index of the second short sequence, and the first short sequence may have a cyclic shift that is a same cyclic shift as the second short sequence. In such cases, the cross correlation between the first short sequence and the second short sequence may be small. In some cases, at least one short sequence of the plurality of short sequences comprises a root index and cyclic shift that is different from a root index and a cyclic shift of another short sequence of the plurality of short sequences.

In some cases, reference signal sequence manager 925 may concatenate the plurality of short sequences to generate a reference signal sequence for the reference signal. In some cases, a guard band is omitted between each of the short sequences of the reference signal sequence that is used for the reference signal (e.g., a first short sequence is adjacent to a second short sequence in the time domain). In some cases, the plurality of short sequences may comprise a first short sequence and a second short sequence, where the second short sequence is a repetition of the first short sequence. The repetition may be based on one or both of a time domain and a frequency domain.

In some cases, reference signal sequence manager 925 may identify, based on a size of a first subset of frequency resources and a second subset of time resources, a square matrix having mutually orthogonal rows, select a first submatrix of the square matrix based on a distance to the base station, and segment the first submatrix into a number of short sequences to be included in the reference signal, each short sequence of the number of short sequences having a length that corresponds to the first subset of frequency resources and the number of short sequences corresponding to a number of time resources within the second subset of time resources. In some cases, reference signal sequence manager 925 may perform, for each row of a subset of rows in the submatrix, an IDFT to generate a set of prototype sequences, and may perform, on each prototype sequence, a DFT to generate a frequency-domain sub-sequence.

In some cases, the identifying the plurality of short sequences includes determining the root index and cyclic shift for each short sequence within a set of frequency domain resources. In some cases, the selecting the first submatrix includes selecting a subset of rows of the square matrix. In some cases, the segmenting the first submatrix into the number of short sequences includes identifying a number of symbols within the second subset of time resources, and segmenting the set of prototype sequences into a set of sub-sequences based on the number of symbols.

In some cases, the set of resources include frequency resources and time resources, and where a first short sequence of the plurality of short sequences is applied to a first subset of the frequency resources that are located within a first subset of the time resources, and a second short sequence of the plurality of short sequences is applied to a second subset of the frequency resources that are located within a second subset of the time resources. In some cases, reference signal sequence manager 925 may apply a transmission power weight to at least one short sequence of the plurality of short sequences that is different from a transmission power weight applied to another short sequence of the plurality of short sequences.

In some cases, the plurality of short sequences each include a portion of a linear block code that can be successfully decoded if an error in receiving one or more portions of the linear block code occurs. In some cases, the linear block code is an error-correcting code. In some cases, reference signal sequence manager 925 may apply a cover code to at least one short sequence of the plurality of short sequences that is different from a cover code applied to another short sequence of the plurality of short sequences. In some cases, the cover code applied to the at least one short sequence of the plurality of short sequences is one of an orthogonal cover code or a quasi-orthogonal cover code. In some cases, reference signal sequence manager 925 may apply a coding constraint to at least one short sequence of the plurality of short sequences based at least in part on another short sequence of the plurality of short sequences. For example, six short sequences may be used in generating a reference signal sequence that is applied to the set of time and frequency resources. In some examples, a first short sequence through fourth short sequence may be selected (e.g., randomly or based on the cross-correlation aspects discussed herein), but the fifth short sequence and sixth short sequence may be based at least in part on the first through fourth short sequences. For example, one or both of the fifth and sixth short sequences may include one or more error-correction bits (e.g., FEC bits or parity-check bits) corresponding to the information bits in the first through fourth short sequences.

In some cases, the square matrix is a Hadamard matrix having a size that is based on the first subset of frequency resources and the second subset of time resources. In some cases, the error-correcting code includes a Reed Solomon code, a BCH code, a Reed Muller code, a Hamming code, or other error-correcting code. In some cases, the threshold value is based on a one or more of a cell radius of the base station, a multipath delay spread associated with the base station, or any combination thereof. In some cases, each short sequence of the plurality of short sequences is a CAZAC sequence, a PN sequence, a Kasami sequence, or a Golay sequence.

Reference signal transmission manager 930 may transmit the reference signal to the base station and transmit the reference signal to the base station using the set of resources.

Resource mapping component 935 may map each of the plurality of short sequences to each of a corresponding set of time domain resources and map each frequency-domain sub-sequence to each symbol of the number symbols.

Codebook component 940 may select a subset of the plurality of short sequences as the set of short sequences based on a UE identification. In some cases, the identifying the plurality of short sequences includes identifying, based on the set of resources, a codebook containing a set of short sequences. In some cases, each short sequence of the set of short sequence may relate to a code symbol that includes information symbols and/or parity symbols. In some cases, the codebook to be used by the UE may be based on a quantity of the set of resources (e.g., time and frequency resources) allocated for the reference signal sequence of the reference signal. For example, if six resource blocks are allocated for the reference signal sequence of the reference signal, then six code symbols (e.g., six short sequences) may be available for use by the UE in transmitting the reference signal. Additionally or alternatively, whether or not a codeword for the UE is a binary codeword or non-binary codeword may be based on how many UEs could possibly be transmitting a reference signal (e.g., a non-orthogonal DMRS) and how many distinctive codewords a particular codebook is capable of providing. In some cases, codebook component 940 may apply a code-symbol-to-short-sequence mapping scheme. For example, in a case where six different code symbols are available, a binary codeword may be created, whereas in a case where eight different code symbols are available, a non-binary codeword may be created.

Distance estimation component 945 may estimate the distance to the base station based on a broadcast transmission from the base station.

Figure 10:
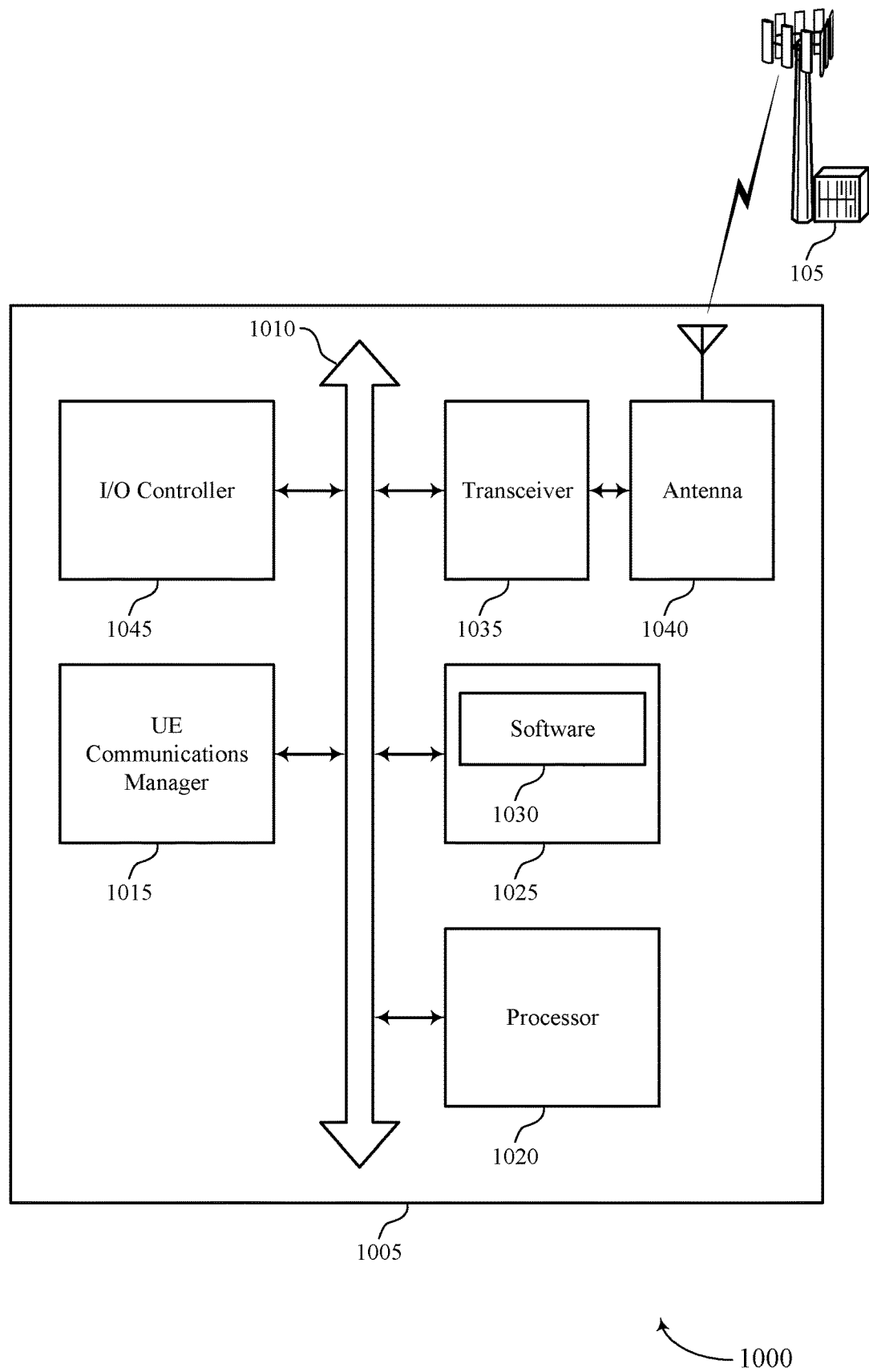
FIG. 10 illustrates a block diagram of a system including a UE that supports reference signal transmission techniques for NOMA wireless communications in accordance with aspects of the present disclosure.

FIG. 10 shows a diagram of a system 1000 including a device 1005 that supports reference signal transmission techniques for NOMA wireless communications in accordance with aspects of the present disclosure. Device 1005 may be an example of or include the components of wireless device 705, wireless device 805, or a UE 115 as described above, e.g., with reference to FIGS. 7 and 8. Device 1005 may include components for bi-directional voice and data communications including components for transmitting and receiving communications, including UE communications manager 1015, processor 1020, memory 1025, software 1030, transceiver 1035, antenna 1040, and I/O controller 1045. These components may be in electronic communication via one or more buses (e.g., bus 1010). Device 1005 may communicate wirelessly with one or more base stations 105.

Processor 1020 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1020 may be configured to operate a memory array using a memory controller. In other cases, a memory controller may be integrated into processor 1020. Processor 1020 may be configured to execute computer-readable instructions stored in a memory to perform various functions (e.g., functions or tasks supporting reference signal transmission techniques for NOMA wireless communications).

Memory 1025 may include random access memory (RAM) and read only memory (ROM). The memory 1025 may store computer-readable, computer-executable software 1030 including instructions that, when executed, cause the processor to perform various functions described herein. In some cases, the memory 1025 may contain, among other things, a basic input/output system (BIOS) which may control basic hardware or software operation such as the interaction with peripheral components or devices.

Software 1030 may include code to implement aspects of the present disclosure, including code to support reference signal transmission techniques for NOMA wireless communications. Software 1030 may be stored in a non-transitory computer-readable medium such as system memory or other memory. In some cases, the software 1030 may not be directly executable by the processor but may cause a computer (e.g., when compiled and executed) to perform functions described herein.

Transceiver 1035 may communicate bi-directionally, via one or more antennas, wired, or wireless links as described above. For example, the transceiver 1035 may represent a wireless transceiver and may communicate bi-directionally with another wireless transceiver. The transceiver 1035 may also include a modem to modulate the packets and provide the modulated packets to the antennas for transmission, and to demodulate packets received from the antennas.

In some cases, the wireless device may include a single antenna 1040. However, in some cases the device may have more than one antenna 1040, which may be capable of concurrently transmitting or receiving multiple wireless transmissions.

I/O controller 1045 may manage input and output signals for device 1005. I/O controller 1045 may also manage peripherals not integrated into device 1005. In some cases, I/O controller 1045 may represent a physical connection or port to an external peripheral. In some cases, I/O controller 1045 may utilize an operating system such as iOS®, ANDROID®, MS-DOS®, MS-WINDOWS®, OS/2®, UNIX®, LINUX®, or another known operating system. In other cases, I/O controller 1045 may represent or interact with a modem, a keyboard, a mouse, a touchscreen, or a similar device. In some cases, I/O controller 1045 may be implemented as part of a processor. In some cases, a user may interact with device 1005 via I/O controller 1045 or via hardware components controlled by I/O controller 1045.

Figure 11:
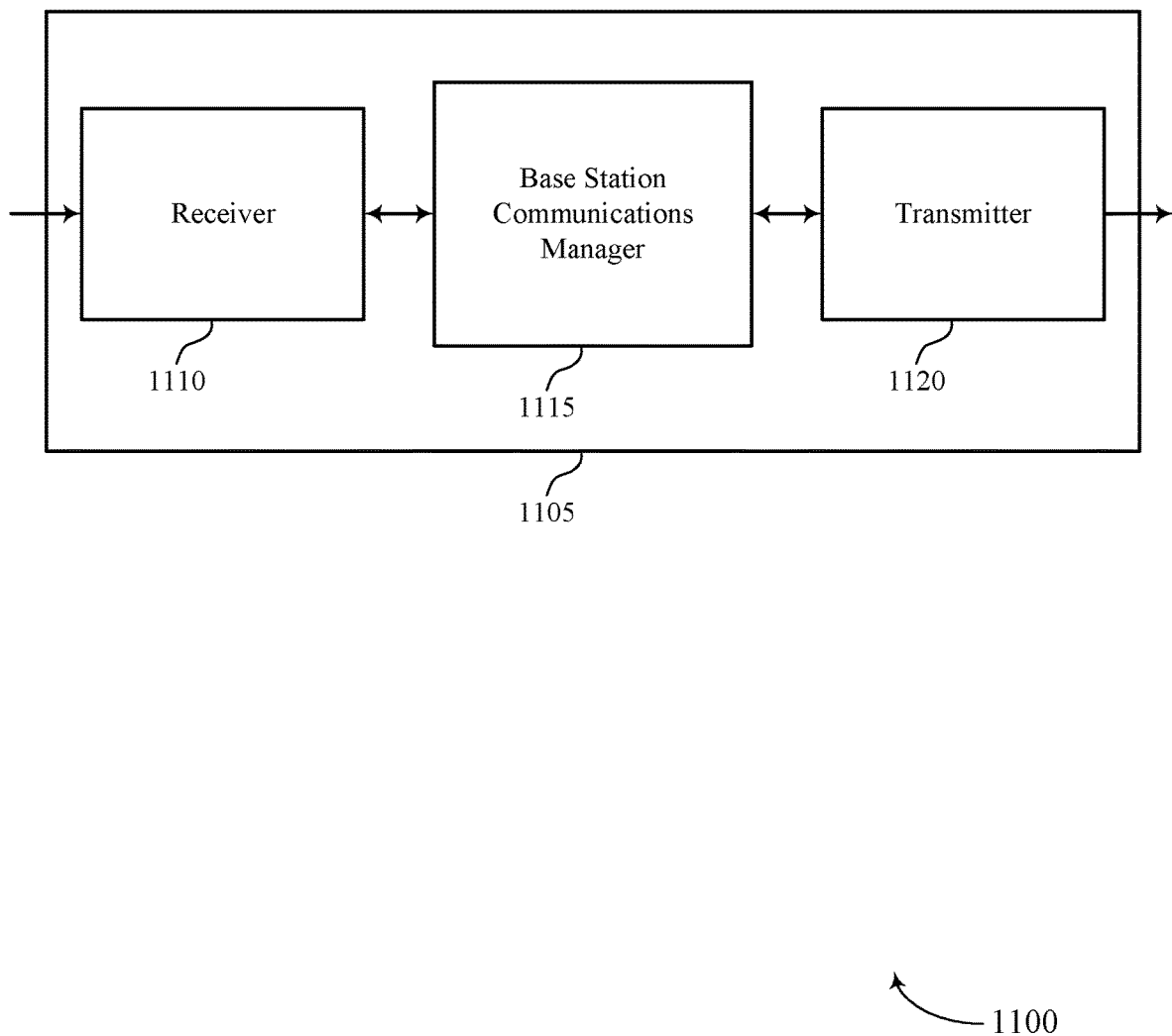
FIGS. 11 through 13 show block diagrams of a device that supports reference signal transmission techniques for NOMA wireless communications in accordance with aspects of the present disclosure.

FIG. 11 shows a block diagram 1100 of a wireless device 1105 that supports reference signal transmission techniques for NOMA wireless communications in accordance with aspects of the present disclosure. Wireless device 1105 may be an example of aspects of a base station 105 as described herein. Wireless device 1105 may include receiver 1110, base station communications manager 1115, and transmitter 1120. Wireless device 1105 may also include a processor. Each of these components may be in communication with one another (e.g., via one or more buses).

Receiver 1110 may receive information such as packets, user data, or control information associated with various information channels (e.g., control channels, data channels, and information related to reference signal transmission techniques for NOMA wireless communications, etc.). Information may be passed on to other components of the device. The receiver 1110 may be an example of aspects of the transceiver 1435 described with reference to FIG. 14. The receiver 1110 may utilize a single antenna or a set of antennas.

Base station communications manager 1115 may be an example of aspects of the base station communications manager 1415 described with reference to FIG. 14.

Base station communications manager 1115 and/or at least some of its various sub-components may be implemented in hardware, software executed by a processor, firmware, or any combination thereof. If implemented in software executed by a processor, the functions of the base station communications manager 1115 and/or at least some of its various sub-components may be executed by a general-purpose processor, a DSP, an ASIC, an FPGA or other programmable logic device, discrete gate or transistor logic, discrete hardware components, or any combination thereof designed to perform the functions described in the present disclosure. The base station communications manager 1115 and/or at least some of its various sub-components may be physically located at various positions, including being distributed such that portions of functions are implemented at different physical locations by one or more physical devices. In some examples, base station communications manager 1115 and/or at least some of its various sub-components may be a separate and distinct component in accordance with various aspects of the present disclosure. In other examples, base station communications manager 1115 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Base station communications manager 1115 may allocate, at a base station, a set of resources for transmission of a set of at least partially concurrent reference signal transmissions from a set of NOMA transmitters, transmit an indication of the set of resources to the set of NOMA transmitters, identify, based on the set of resources, a codebook of available short sequences to be concatenated to form a reference signal sequence at each of the set of NOMA transmitters, each short sequence of the codebook of available short sequences having a root index and cyclic shift that provides a cross-correlation with other of the codebook of available short sequences that is below a threshold value, receive two or more reference signal transmissions from at least a subset of the set of NOMA transmitters, and estimate one or more channel characteristics of each of the subset of the set of NOMA transmitters based on the reference signal sequence of each of the set of NOMA transmitters.

The base station communications manager 1115 may also transmit an indication of a set of resources to a set of NOMA transmitters, the set of resources including a first subset of frequency resources and a second subset of time resources for transmission of a set of at least partially concurrent reference signal transmissions, identify, based on a size of the first subset of frequency resources and the second subset of time resources, a square matrix having mutually orthogonal rows, select a first submatrix of the square matrix based on a distance to at least a first NOMA transmitter of the set of NOMA transmitters, segment the first submatrix into a number of short sequences to be included in a first reference signal transmitted by the first NOMA transmitter, each short sequence of the number of short sequences having a length that corresponds to the first subset of frequency resources and the number of short sequences corresponding to a number of time resources within the second subset of time resources, receive two or more reference signal transmissions, including the first reference signal and at least one other reference signal from one or more other NOMA transmitters of the set of NOMA transmitters, and estimate one or more channel characteristics of the first NOMA transmitter based on the short sequences included in the first reference signal.

Transmitter 1120 may transmit signals generated by other components of the device. In some examples, the transmitter 1120 may be collocated with a receiver 1110 in a transceiver module. For example, the transmitter 1120 may be an example of aspects of the transceiver 1435 described with reference to FIG. 14. The transmitter 1120 may utilize a single antenna or a set of antennas.

Figure 12:
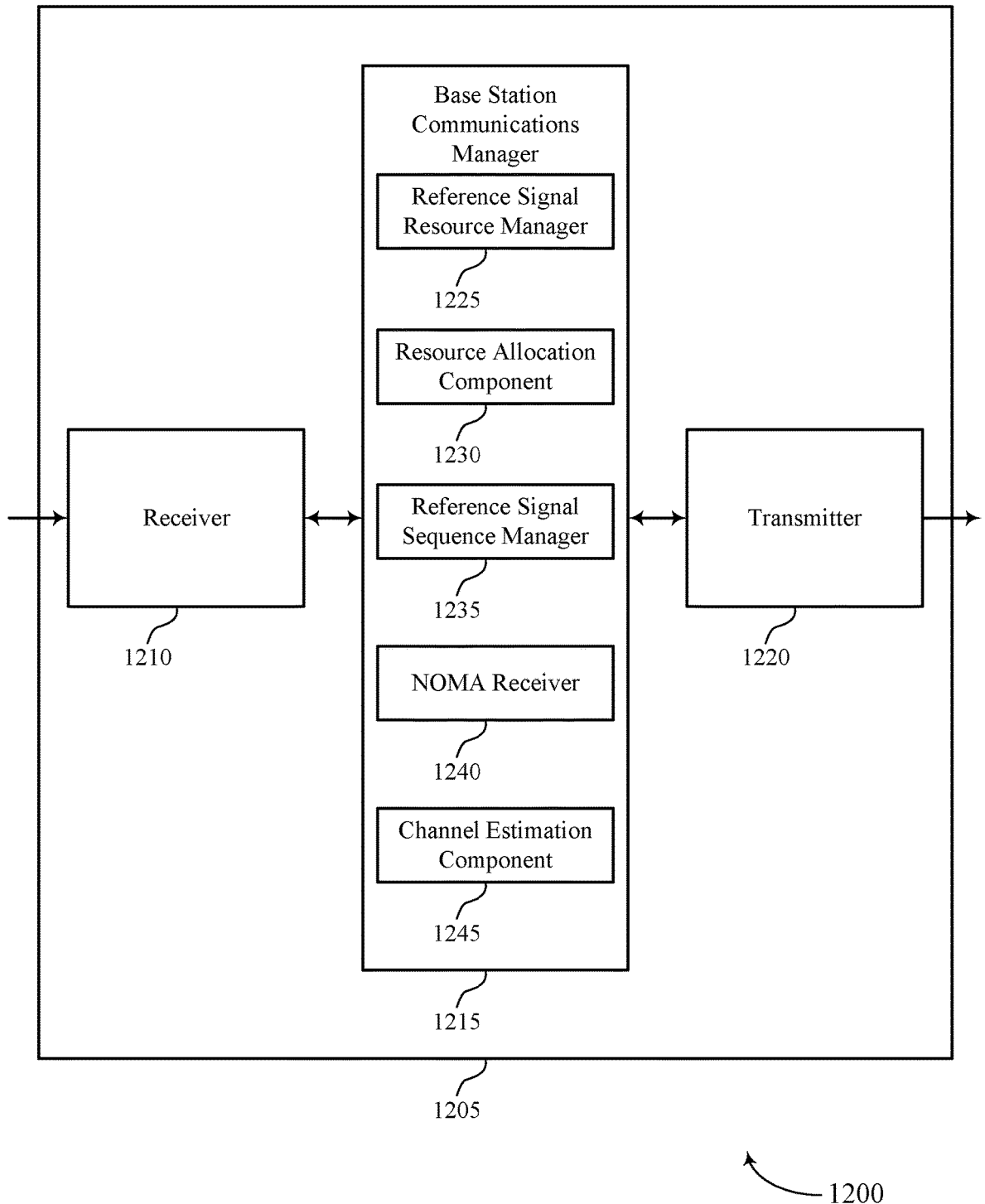

FIG. 12 shows a block diagram 1200 of a wireless device 1205 that supports reference signal transmission techniques for NOMA wireless communications in accordance with aspects of the present disclosure. Wireless device 1205 may be an example of aspects of a wireless device 1105 or a base station 105 as described with reference to FIG. 11. Wireless device 1205 may include receiver 1210, base station communications manager 1215, and transmitter 1220. Wireless device 1205 may also include a processor. Each of these components may be in communication with one another (e.g., via one or more buses).

Receiver 1210 may receive information such as packets, user data, or control information associated with various information channels (e.g., control channels, data channels, and information related to reference signal transmission techniques for NOMA wireless communications, etc.). Information may be passed on to other components of the device. The receiver 1210 may be an example of aspects of the transceiver 1435 described with reference to FIG. 14. The receiver 1210 may utilize a single antenna or a set of antennas.

Base station communications manager 1215 may be an example of aspects of the base station communications manager 1415 described with reference to FIG. 14. Base station communications manager 1215 may also include reference signal resource manager 1225, resource allocation component 1230, reference signal sequence manager 1235, NOMA receiver 1240, and channel estimation component 1245.

Reference signal resource manager 1225 may allocate, a set of resources for transmission of a set of at least partially concurrent reference signal transmissions from a set of NOMA transmitters, the set of resources including a first subset of frequency resources and a second subset of time resources for transmission of a set of at least partially concurrent reference signal transmissions. In some cases, reference signal resource manager 1225 may transmit a reference signal length indication to the first NOMA transmitter, and select a first submatrix of a square matrix based on the reference signal length indication.

Resource allocation component 1230 may transmit an indication of the set of resources to the set of NOMA transmitters.

Reference signal sequence manager 1235 may identify reference signal sequences according to techniques as described herein. In some cases, reference signal sequence manager 1235 may identify a reference signal sequence based on the set of resources and a codebook of available short sequences to be concatenated to form a reference signal sequence at each of the set of NOMA transmitters. In some cases, each short sequence of the codebook of available short sequences has a root index and cyclic shift that provides a cross-correlation with other of the codebook of available short sequences that is below a threshold value. In some cases, each short sequence of the number of short sequences has a length that corresponds to the first subset of frequency resources and the number of short sequences corresponding to a number of time resources within the second subset of time resources. In some cases, the set of resources include frequency resources and time resources, and where a first short sequence of the codebook of available short sequences is applied to a first subset of the frequency resources that are located within a first subset of the time resources, and a second short sequence of the codebook of available short sequences is applied to a second subset of the frequency resources that are located within a second subset of the time resources. In some cases, the available short sequences each include a portion of a linear block code that can be successfully decoded if an error in receiving one or more portions of the linear block code occurs. In some cases, the linear block code is an error-correcting code.

In some cases, reference signal sequence manager 1235 may identify, based on a size of the first subset of frequency resources and the second subset of time resources, a square matrix having mutually orthogonal rows, select a first submatrix of the square matrix based on a distance to at least a first NOMA transmitter of the set of NOMA transmitters, and segment the first submatrix into a number of short sequences to be included in a first reference signal transmitted by the first NOMA transmitter. In some cases, reference signal sequence manager 1235 may perform, for each row of a subset of rows in the submatrix, an IDFT to generate a set of prototype sequences, segment the set of prototype sequences into a set of sub-sequences based on the number of time resources, and perform, on each sub-sequence, a DFT to generate a frequency-domain sub-sequence. In some cases, the segmenting the first submatrix into the number of short sequences includes identifying a number of time resources within the second subset of time resources. In some cases, the square matrix is a Hadamard matrix having a size that is based on the first subset of frequency resources and the second subset of time resources.

In some cases, a threshold value is based on a one or more of a cell radius of the base station, a multipath delay spread associated with the base station, or any combination thereof and is used for selecting a reference signal sequence. In some cases, the reference signal sequence allows for asynchronous reference signal transmissions from multiple NOMA transmitters. In some cases, each short sequence of the codebook of available short sequences is a CAZAC sequence, a PN sequence, a Kasami sequence, or a Golay sequence.

NOMA receiver 1240 may receive two or more reference signal transmissions from at least a subset of the set of NOMA transmitters, and perform successive interference cancellation on the two or more reference signal transmissions to identify a first reference signal transmission from a first NOMA transmitter.

Channel estimation component 1245 may estimate one or more channel characteristics of each of the subset of the set of NOMA transmitters based on the reference signal sequence of each of the set of NOMA transmitters.

Transmitter 1220 may transmit signals generated by other components of the device. In some examples, the transmitter 1220 may be collocated with a receiver 1210 in a transceiver module. For example, the transmitter 1220 may be an example of aspects of the transceiver 1435 described with reference to FIG. 14. The transmitter 1220 may utilize a single antenna or a set of antennas.

Figure 13:
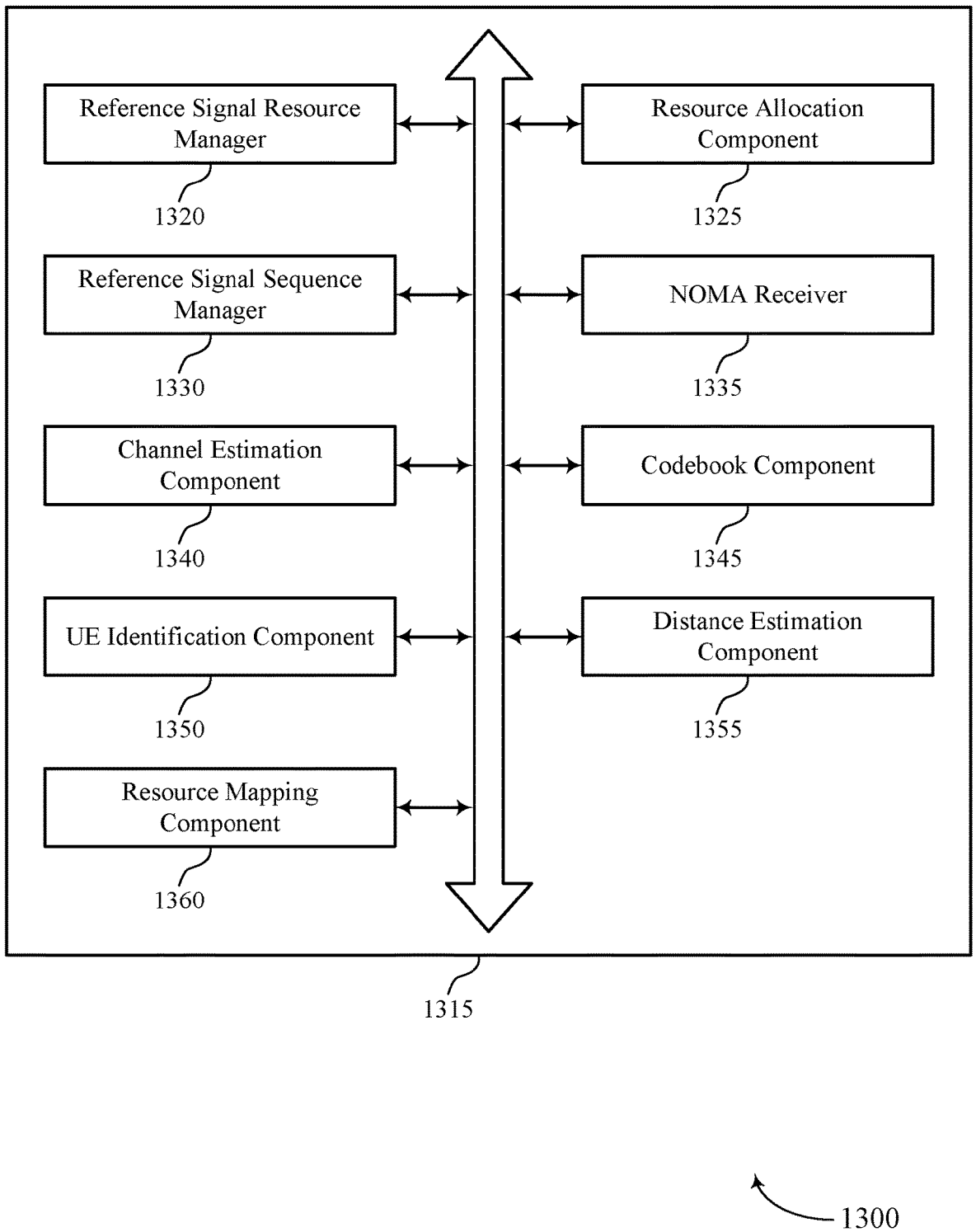

FIG. 13 shows a block diagram 1300 of a base station communications manager 1315 that supports reference signal transmission techniques for NOMA wireless communications in accordance with aspects of the present disclosure. The base station communications manager 1315 may be an example of aspects of a base station communications manager 1415 described with reference to FIGS. 11, 12, and 14. The base station communications manager 1315 may include reference signal resource manager 1320, resource allocation component 1325, reference signal sequence manager 1330, NOMA receiver 1335, channel estimation component 1340, codebook component 1345, UE identification component 1350, distance estimation component 1355, and resource mapping component 1360. Each of these modules may communicate, directly or indirectly, with one another (e.g., via one or more buses).

Reference signal resource manager 1320 may allocate, a set of resources for transmission of a set of at least partially concurrent reference signal transmissions from a set of NOMA transmitters, the set of resources including a first subset of frequency resources and a second subset of time resources for transmission of a set of at least partially concurrent reference signal transmissions. In some cases, reference signal resource manager 1320 may transmit a reference signal length indication to the first NOMA transmitter, and select a first submatrix of a square matrix based on the reference signal length indication.

Resource allocation component 1325 may transmit an indication of the set of resources to the set of NOMA transmitters.

Reference signal sequence manager 1330 may identify reference signal sequences according to techniques as described herein. In some cases, reference signal sequence manager 1330 may identify a reference signal sequence based on the set of resources and a codebook of available short sequences to be concatenated to form a reference signal sequence at each of the set of NOMA transmitters. In some cases, each short sequence of the codebook of available short sequences has a root index and cyclic shift that provides a cross-correlation with other of the codebook of available short sequences that is below a threshold value. In some cases, each short sequence of the number of short sequences has a length that corresponds to the first subset of frequency resources and the number of short sequences corresponding to a number of time resources within the second subset of time resources. In some cases, the set of resources include frequency resources and time resources, and where a first short sequence of the codebook of available short sequences is applied to a first subset of the frequency resources that are located within a first subset of the time resources, and a second short sequence of the codebook of available short sequences is applied to a second subset of the frequency resources that are located within a second subset of the time resources. In some cases, the available short sequences each include a portion of a linear block code that can be successfully decoded if an error in receiving one or more portions of the linear block code occurs. In some cases, the linear block code is an error-correcting code.

In some cases, reference signal sequence manager 1330 may identify, based on a size of the first subset of frequency resources and the second subset of time resources, a square matrix having mutually orthogonal rows, select a first submatrix of the square matrix based on a distance to at least a first NOMA transmitter of the set of NOMA transmitters, and segment the first submatrix into a number of short sequences to be included in a first reference signal transmitted by the first NOMA transmitter. In some cases, reference signal sequence manager 1330 may perform, for each row of a subset of rows in the submatrix, an IDFT to generate a set of prototype sequences, segment the set of prototype sequences into a set of sub-sequences based on the number of time resources, and perform, on each sub-sequence, a DFT to generate a frequency-domain sub-sequence. In some cases, the segmenting the first submatrix into the number of short sequences includes identifying a number of time resources within the second subset of time resources. In some cases, the square matrix is a Hadamard matrix having a size that is based on the first subset of frequency resources and the second subset of time resources.

In some cases, a threshold value is based on a one or more of a cell radius of the base station, a multipath delay spread associated with the base station, or any combination thereof and is used for selecting a reference signal sequence. In some cases, the reference signal sequence allows for asynchronous reference signal transmissions from multiple NOMA transmitters. In some cases, each short sequence of the codebook of available short sequences is a CAZAC sequence, a PN sequence, a Kasami sequence, or a Golay sequence.

NOMA receiver 1335 may receive two or more reference signal transmissions from at least a subset of the set of NOMA transmitters, and perform successive interference cancellation on the two or more reference signal transmissions to identify a first reference signal transmission from a first NOMA transmitter.

Channel estimation component 1340 may estimate one or more channel characteristics of each of the subset of the set of NOMA transmitters based on the reference signal sequence of each of the set of NOMA transmitters.

Codebook component 1345 may configure one or more codebooks of reference signal sequences. In some cases, a codebook of available short sequences identifies the root index and cyclic shift for each short sequence within a set of frequency domain resources, and maps each of the short sequences to each of a corresponding set of time domain resources.

UE identification component 1350 may identify, based on the first reference signal transmission, a UE identification of the first NOMA transmitter. Distance estimation component 1355 may estimate the distance to the first NOMA transmitter based on a transmission from the first NOMA transmitter. Resource mapping component 1360 may map each frequency-domain sub-sequence to each of the number of time resources.

Figure 14:
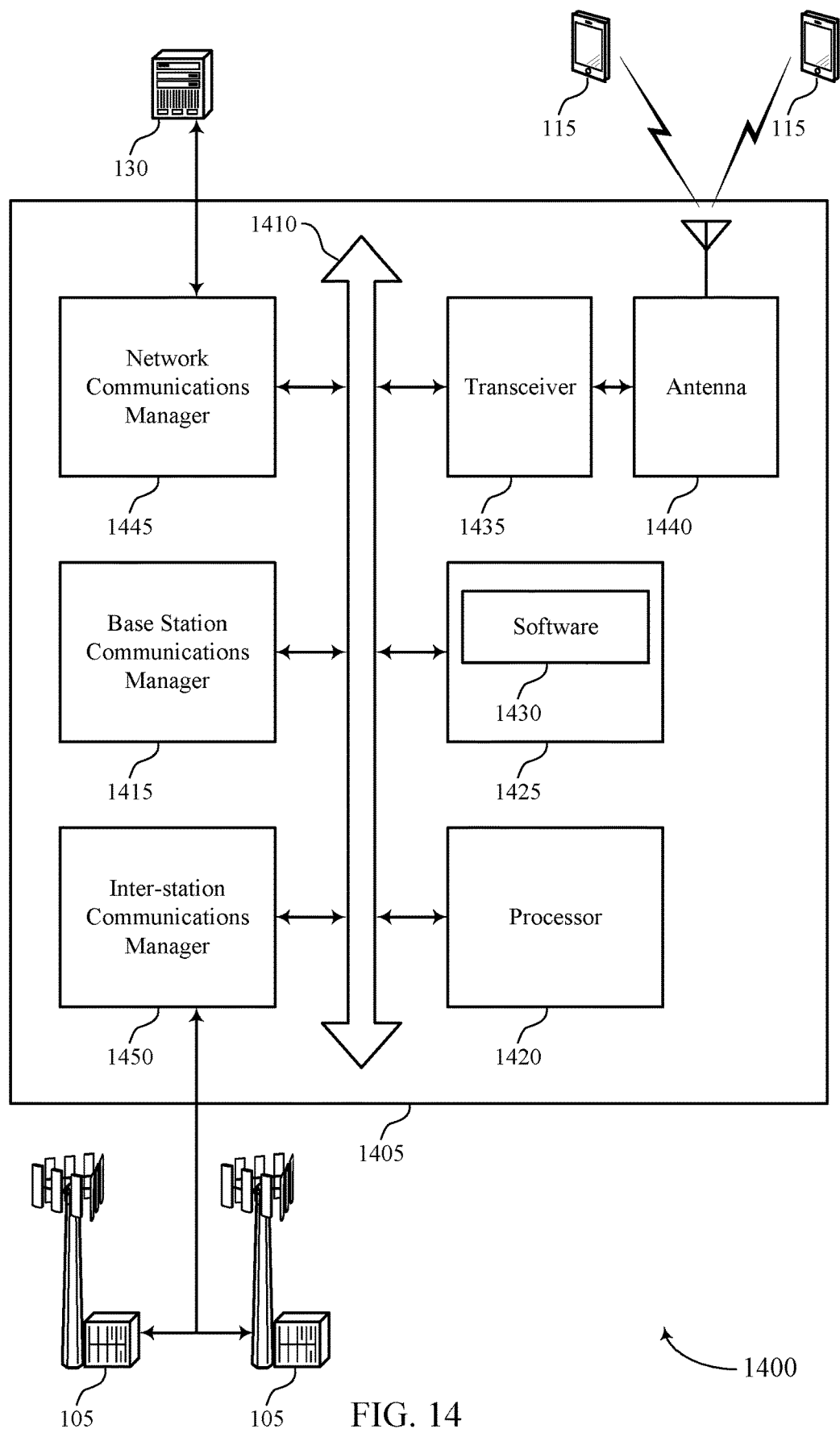
FIG. 14 illustrates a block diagram of a system including a base station that supports reference signal transmission techniques for NOMA wireless communications in accordance with aspects of the present disclosure.

FIG. 14 shows a diagram of a system 1400 including a device 1405 that supports reference signal transmission techniques for NOMA wireless communications in accordance with aspects of the present disclosure. Device 1405 may be an example of or include the components of base station 105 as described above, e.g., with reference to FIG. 1. Device 1405 may include components for bi-directional voice and data communications including components for transmitting and receiving communications, including base station communications manager 1415, processor 1420, memory 1425, software 1430, transceiver 1435, antenna 1440, network communications manager 1445, and inter-station communications manager 1450. These components may be in electronic communication via one or more buses (e.g., bus 1410). Device 1405 may communicate wirelessly with one or more UEs 115.

Processor 1420 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1420 may be configured to operate a memory array using a memory controller. In other cases, a memory controller may be integrated into processor 1420. Processor 1420 may be configured to execute computer-readable instructions stored in a memory to perform various functions (e.g., functions or tasks supporting reference signal transmission techniques for NOMA wireless communications).

Memory 1425 may include RAM and ROM. The memory 1425 may store computer-readable, computer-executable software 1430 including instructions that, when executed, cause the processor to perform various functions described herein. In some cases, the memory 1425 may contain, among other things, a BIOS which may control basic hardware or software operation such as the interaction with peripheral components or devices.

Software 1430 may include code to implement aspects of the present disclosure, including code to support reference signal transmission techniques for NOMA wireless communications. Software 1430 may be stored in a non-transitory computer-readable medium such as system memory or other memory. In some cases, the software 1430 may not be directly executable by the processor but may cause a computer (e.g., when compiled and executed) to perform functions described herein.

Transceiver 1435 may communicate bi-directionally, via one or more antennas, wired, or wireless links as described above. For example, the transceiver 1435 may represent a wireless transceiver and may communicate bi-directionally with another wireless transceiver. The transceiver 1435 may also include a modem to modulate the packets and provide the modulated packets to the antennas for transmission, and to demodulate packets received from the antennas.

In some cases, the wireless device may include a single antenna 1440. However, in some cases the device may have more than one antenna 1440, which may be capable of concurrently transmitting or receiving multiple wireless transmissions.

Network communications manager 1445 may manage communications with the core network (e.g., via one or more wired backhaul links). For example, the network communications manager 1445 may manage the transfer of data communications for client devices, such as one or more UEs 115.

Inter-station communications manager 1450 may manage communications with other base station 105, and may include a controller or scheduler for controlling communications with UEs 115 in cooperation with other base stations 105. For example, the inter-station communications manager 1450 may coordinate scheduling for transmissions to UEs 115 for various interference mitigation techniques such as beamforming or joint transmission. In some examples, inter-station communications manager 1450 may provide an X2 interface within an Long Term Evolution (LTE)/LTE-A wireless communication network technology to provide communication between base stations 105.

Figure 15:
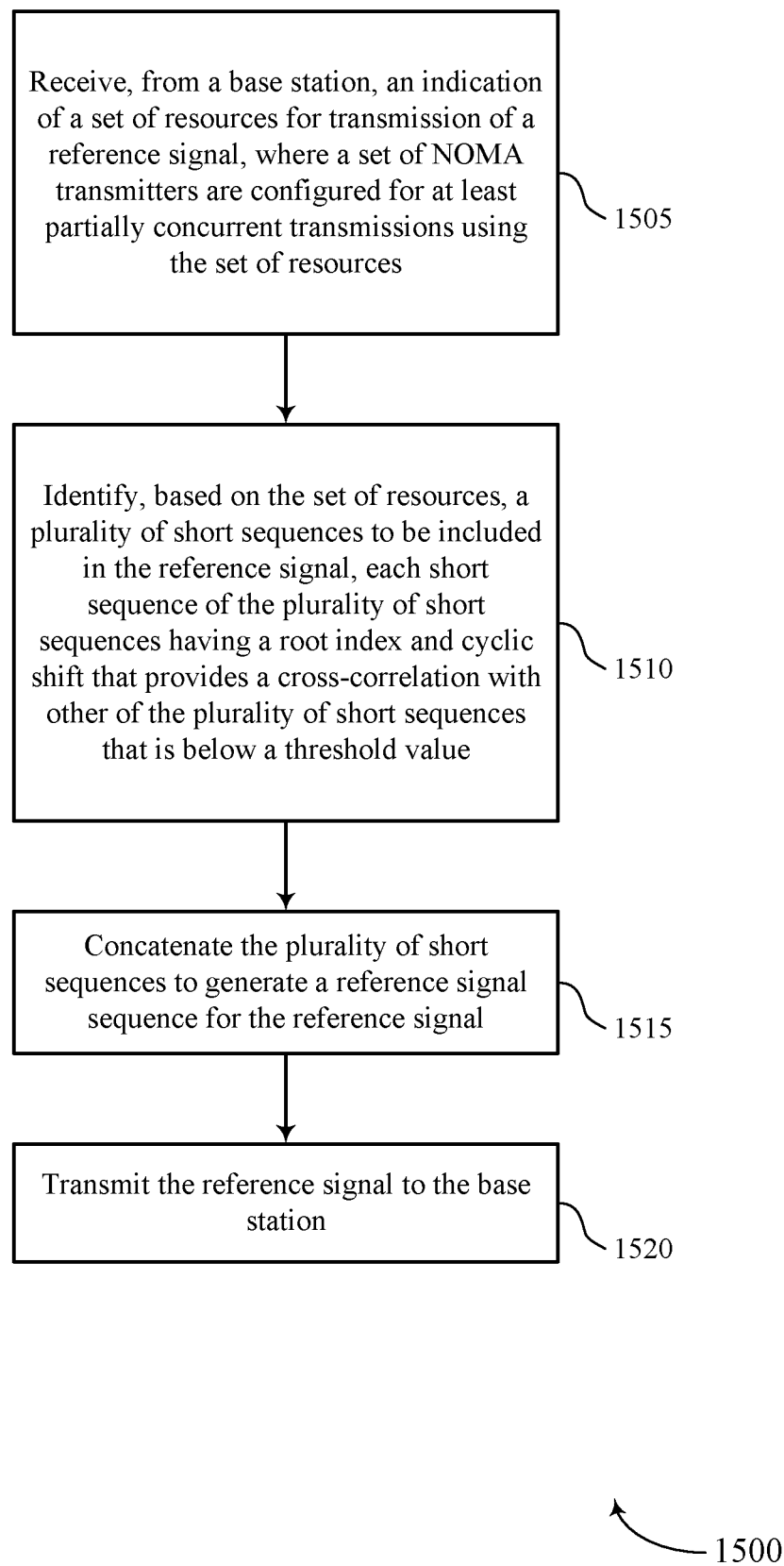
FIGS. 15 through 24 illustrate methods for reference signal transmission techniques for NOMA wireless communications in accordance with aspects of the present disclosure.

FIG. 15 shows a flowchart illustrating a method 1500 for reference signal transmission techniques for NOMA wireless communications in accordance with aspects of the present disclosure. The operations of method 1500 may be implemented by a UE 115 or its components as described herein. For example, the operations of method 1500 may be performed by a UE communications manager as described with reference to FIGS. 7 through 10. In some examples, a UE 115 may execute a set of codes to control the functional elements of the device to perform the functions described below. Additionally or alternatively, the UE 115 may perform aspects of the functions described below using special-purpose hardware.

At 1505 the UE 115 may receive, from a base station, an indication of a set of resources for transmission of a reference signal, wherein a plurality of NOMA transmitters are configured for at least partially concurrent transmissions using the set of resources (e.g., including a NOMA transmitter of UE 115). The operations of 1505 may be performed according to the methods described herein. In certain examples, aspects of the operations of 1505 may be performed by a reference signal resource manager as described with reference to FIGS. 7 through 10.

At 1510 the UE 115 may identify, based at least in part on the set of resources, a plurality of short sequences to be included in the reference signal, each short sequence of the plurality of short sequences having a root index and cyclic shift that provides a cross-correlation with other of the plurality of short sequences that is below a threshold value.

The operations of 1510 may be performed according to the methods described herein. In certain examples, aspects of the operations of 1510 may be performed by a reference signal sequence manager as described with reference to FIGS. 7 through 10.

At 1515 the UE 115 may concatenate the plurality of short sequences to generate a reference signal sequence for the reference signal. The operations of 1515 may be performed according to the methods described herein. In certain examples, aspects of the operations of 1515 may be performed by a reference signal sequence manager as described with reference to FIGS. 7 through 10.

At 1520 the UE 115 may transmit the reference signal to the base station. The operations of 1520 may be performed according to the methods described herein. In certain examples, aspects of the operations of 1520 may be performed by a reference signal transmission manager as described with reference to FIGS. 7 through 10.

Figure 16:
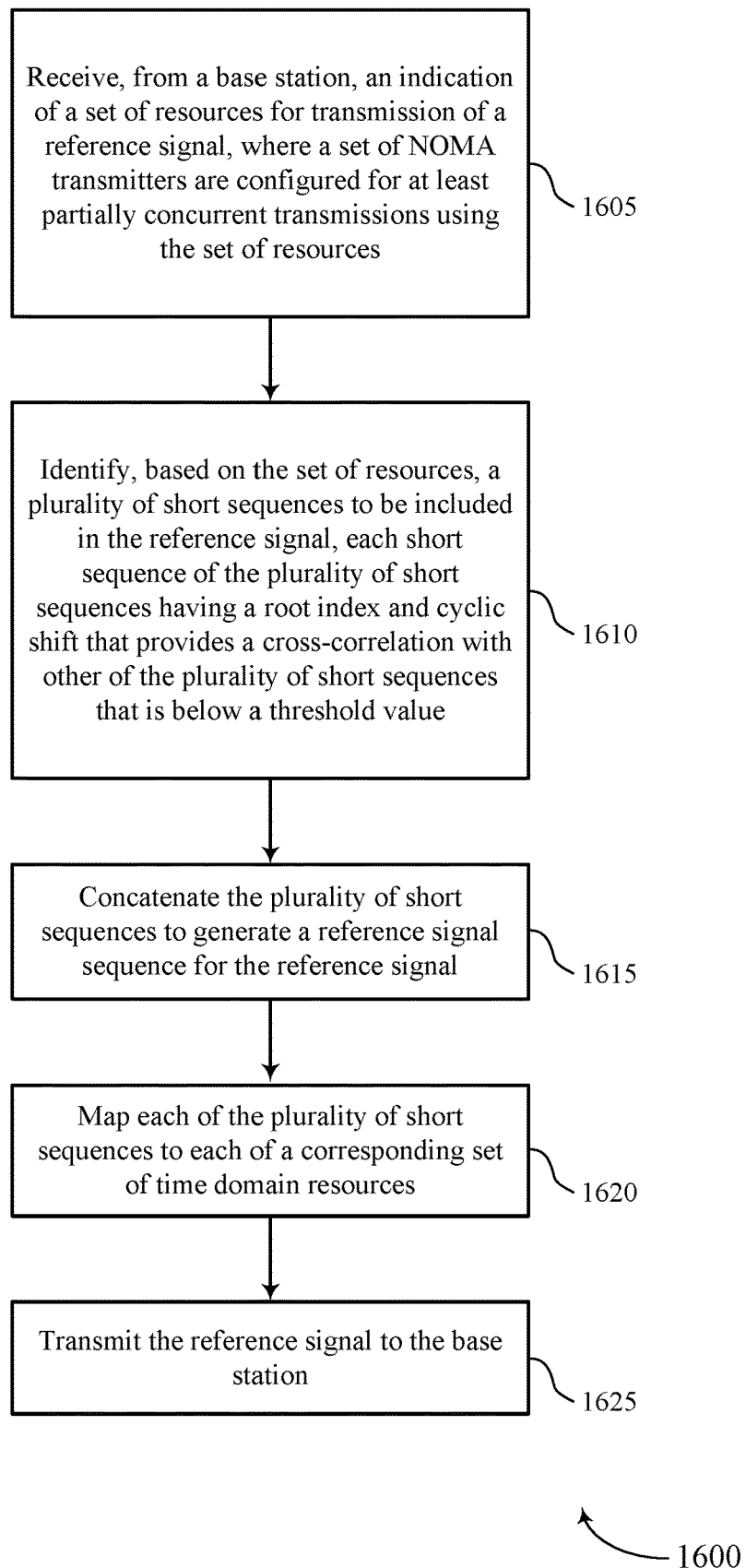

FIG. 16 shows a flowchart illustrating a method 1600 for reference signal transmission techniques for NOMA wireless communications in accordance with aspects of the present disclosure. The operations of method 1600 may be implemented by a UE 115 or its components as described herein. For example, the operations of method 1600 may be performed by a UE communications manager as described with reference to FIGS. 7 through 10. In some examples, a UE 115 may execute a set of codes to control the functional elements of the device to perform the functions described below. Additionally or alternatively, the UE 115 may perform aspects of the functions described below using special-purpose hardware.

At 1605 the UE 115 may receive, from a base station, an indication of a set of resources for transmission of a reference signal, wherein a plurality of NOMA transmitters are configured for at least partially concurrent transmissions using the set of resources (e.g., including a NOMA transmitter of UE 115). The operations of 1605 may be performed according to the methods described herein. In certain examples, aspects of the operations of 1605 may be performed by a reference signal resource manager as described with reference to FIGS. 7 through 10.

At 1610 the UE 115 may identify, based at least in part on the set of resources, a plurality of short sequences to be included in the reference signal, each short sequence of the plurality of short sequences having a root index and cyclic shift that provides a cross-correlation with other of the plurality of short sequences that is below a threshold value. The operations of 1610 may be performed according to the methods described herein. In certain examples, aspects of the operations of 1610 may be performed by a reference signal sequence manager as described with reference to FIGS. 7 through 10. In some cases, the identifying the plurality of short sequences may comprise determining the root index and cyclic shift for each short sequence within a plurality of frequency domain resources.

At 1615 the UE 115 may concatenate the plurality of short sequences to generate a reference signal sequence for the reference signal. The operations of 1615 may be performed according to the methods described herein. In certain examples, aspects of the operations of 1615 may be performed by a reference signal sequence manager as described with reference to FIGS. 7 through 10.

At 1620 the UE 115 may map each of the plurality of short sequences to each of a corresponding plurality of time domain resources. The operations of 1620 may be performed according to the methods described herein. In certain examples, aspects of the operations of 1620 may be performed by a resource mapping component as described with reference to FIGS. 7 through 10.

At 1625 the UE 115 may transmit the reference signal to the base station. The operations of 1625 may be performed according to the methods described herein. In certain examples, aspects of the operations of 1625 may be performed by a reference signal transmission manager as described with reference to FIGS. 7 through 10.

Figure 17:
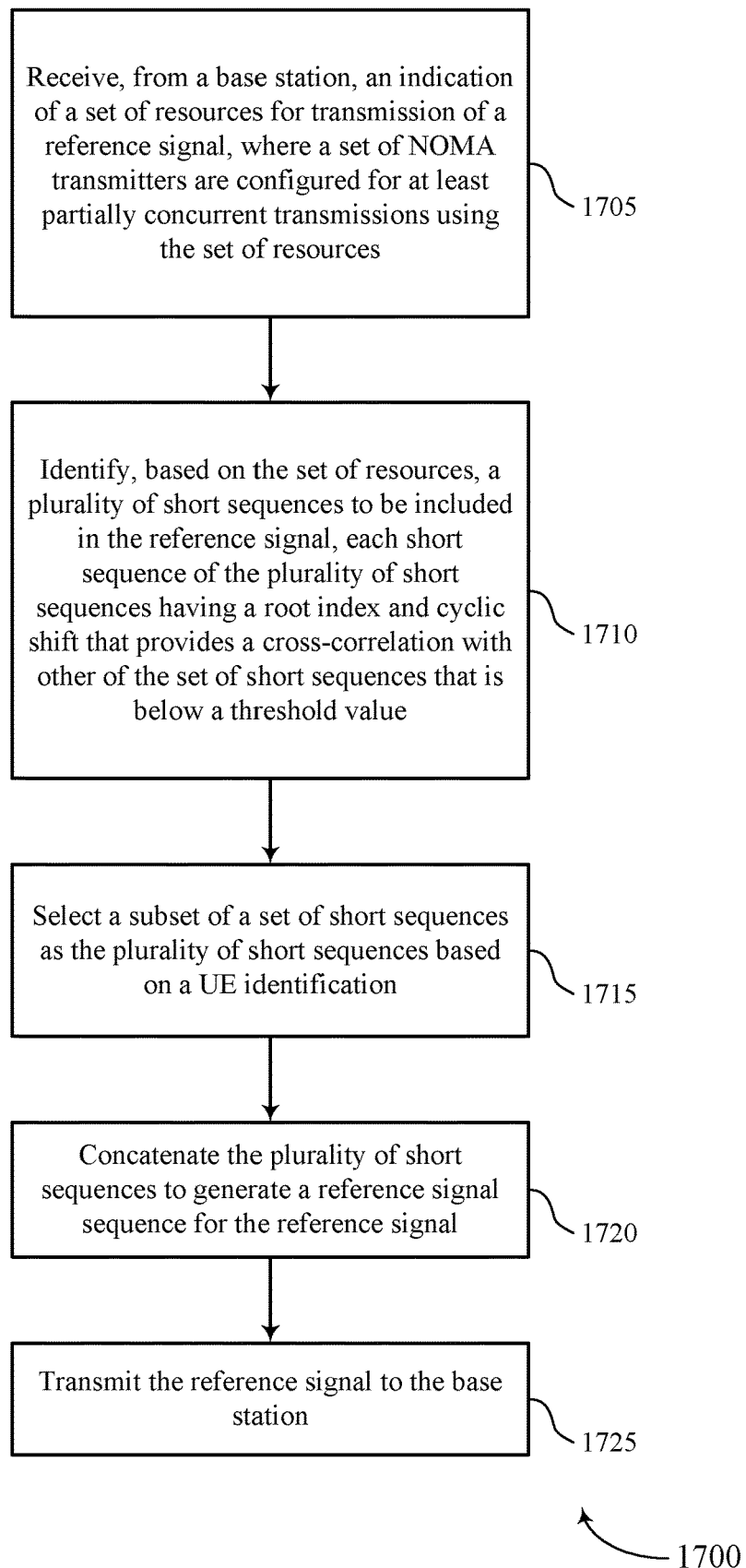

FIG. 17 shows a flowchart illustrating a method 1700 for reference signal transmission techniques for NOMA wireless communications in accordance with aspects of the present disclosure. The operations of method 1700 may be implemented by a UE 115 or its components as described herein. For example, the operations of method 1700 may be performed by a UE communications manager as described with reference to FIGS. 7 through 10. In some examples, a UE 115 may execute a set of codes to control the functional elements of the device to perform the functions described below. Additionally or alternatively, the UE 115 may perform aspects of the functions described below using special-purpose hardware.

At 1705 the UE 115 may receive, from a base station, an indication of a set of resources for transmission of a reference signal, wherein a plurality of NOMA transmitters are configured for at least partially concurrent transmissions using the set of resources (e.g., including a NOMA transmitter of UE 115). The operations of 1705 may be performed according to the methods described herein. In certain examples, aspects of the operations of 1705 may be performed by a reference signal resource manager as described with reference to FIGS. 7 through 10.

At 1710 the UE 115 may identify, based at least in part on the set of resources, a plurality of short sequences to be included in the reference signal, each short sequence of the plurality of short sequences having a root index and cyclic shift that provides a cross-correlation with other of the plurality of short sequences that is below a threshold value. The operations of 1710 may be performed according to the methods described herein. In certain examples, aspects of the operations of 1710 may be performed by a reference signal sequence manager as described with reference to FIGS. 7 through 10. In some cases, the identifying the plurality of short sequences comprises identifying, based at least in part on the set of resources, a codebook containing a set of short sequences.

At 1715 the UE 115 may select a subset of a set of short sequences (e.g., the set of short sequences may be provided by a codebook) as the plurality of short sequences based at least in part on a UE identification. The operations of 1715 may be performed according to the methods described herein. In certain examples, aspects of the operations of 1715 may be performed by a codebook component as described with reference to FIGS. 7 through 10.

At 1720 the UE 115 may concatenate the plurality of short sequences to generate a reference signal sequence for the reference signal. The operations of 1720 may be performed according to the methods described herein. In certain examples, aspects of the operations of 1720 may be performed by a reference signal sequence manager as described with reference to FIGS. 7 through 10.

At 1725 the UE 115 may transmit the reference signal to the base station. The operations of 1725 may be performed according to the methods described herein. In certain examples, aspects of the operations of 1725 may be performed by a reference signal transmission manager as described with reference to FIGS. 7 through 10.

Figure 18:
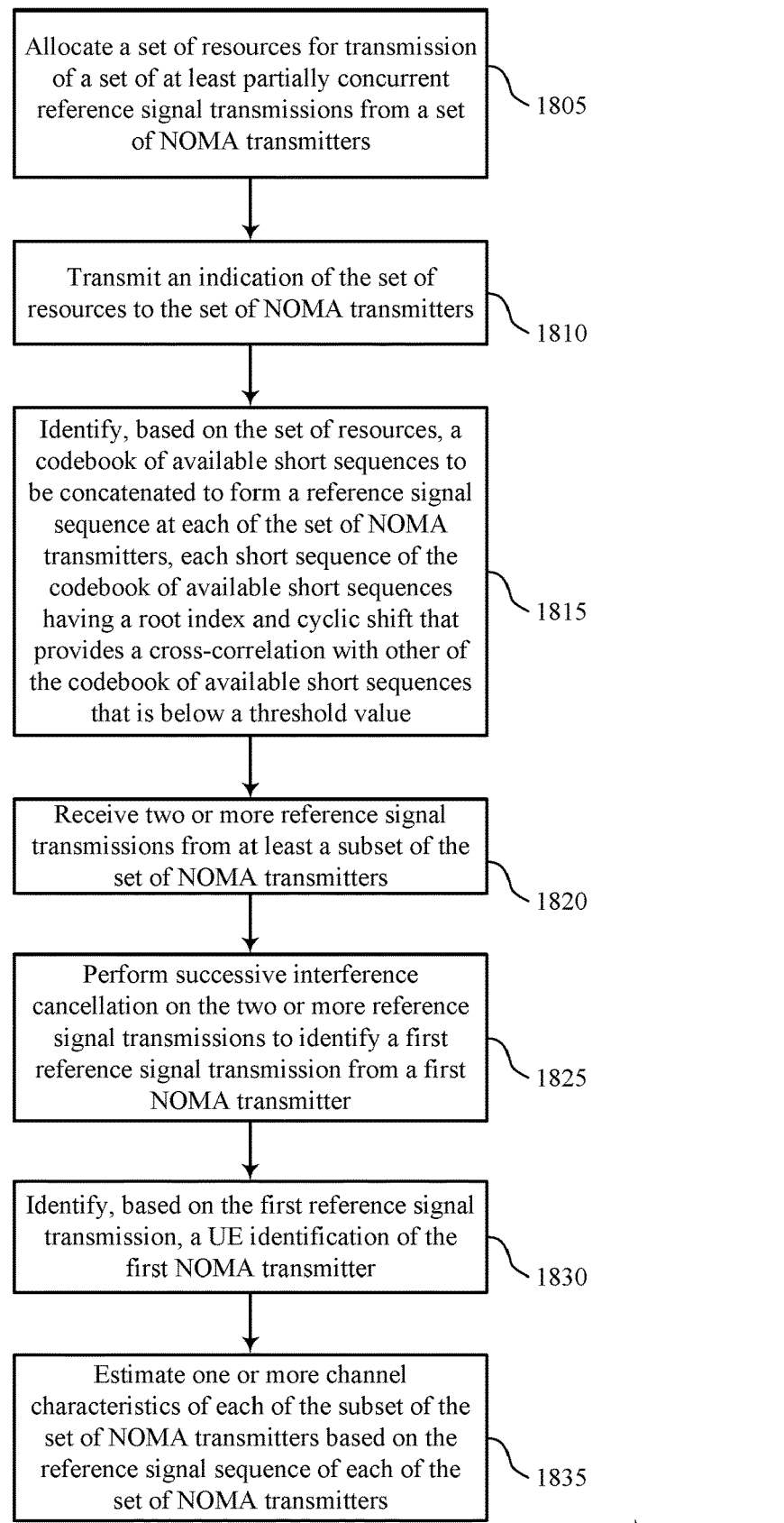

FIG. 18 shows a flowchart illustrating a method 1800 for reference signal transmission techniques for NOMA wireless communications in accordance with aspects of the present disclosure. The operations of method 1800 may be implemented by a base station 105 or its components as described herein. For example, the operations of method 1800 may be performed by a base station communications manager as described with reference to FIGS. 11 through 14. In some examples, a base station 105 may execute a set of codes to control the functional elements of the device to perform the functions described below. Additionally or alternatively, the base station 105 may perform aspects of the functions described below using special-purpose hardware.

At 1805 the base station 105 may allocate a set of resources for transmission of a plurality of at least partially concurrent reference signal transmissions from a plurality of NOMA transmitters. The operations of 1805 may be performed according to the methods described herein. In certain examples, aspects of the operations of 1805 may be performed by a reference signal resource manager as described with reference to FIGS. 11 through 14.

At 1810 the base station 105 may transmit an indication of the set of resources to the plurality of NOMA transmitters. The operations of 1810 may be performed according to the methods described herein. In certain examples, aspects of the operations of 1810 may be performed by a resource allocation component as described with reference to FIGS. 11 through 14.

At 1815 the base station 105 may identify, based at least in part on the set of resources, a codebook of available short sequences to be concatenated to form a reference signal sequence at each of the plurality of NOMA transmitters, each short sequence of the codebook of available short sequences having a root index and cyclic shift that provides a cross-correlation with other of the codebook of available short sequences that is below a threshold value. The operations of 1815 may be performed according to the methods described herein. In certain examples, aspects of the operations of 1815 may be performed by a reference signal sequence manager as described with reference to FIGS. 11 through 14.

At 1820 the base station 105 may receive two or more reference signal transmissions from at least a subset of the plurality of NOMA transmitters. The operations of 1820 may be performed according to the methods described herein. In certain examples, aspects of the operations of 1820 may be performed by a NOMA receiver as described with reference to FIGS. 11 through 14.

At 1825 the base station 105 may perform successive interference cancellation on the two or more reference signal transmissions to identify a first reference signal transmission from a first NOMA transmitter. The operations of 1825 may be performed according to the methods described herein. In certain examples, aspects of the operations of 1825 may be performed by a NOMA receiver as described with reference to FIGS. 11 through 14.

At 1830 the base station 105 may identify, based at least in part on the first reference signal transmission, a UE identification of the first NOMA transmitter. The operations of 1830 may be performed according to the methods described herein. In certain examples, aspects of the operations of 1830 may be performed by a UE identification component as described with reference to FIGS. 11 through 14.

At 1835 the base station 105 may estimate one or more channel characteristics of each of the subset of the plurality of NOMA transmitters based at least in part on the reference signal sequence of each of the plurality of NOMA transmitters. The operations of 1835 may be performed according to the methods described herein. In certain examples, aspects of the operations of 1835 may be performed by a channel estimation component as described with reference to FIGS. 11 through 14.

Figure 19:
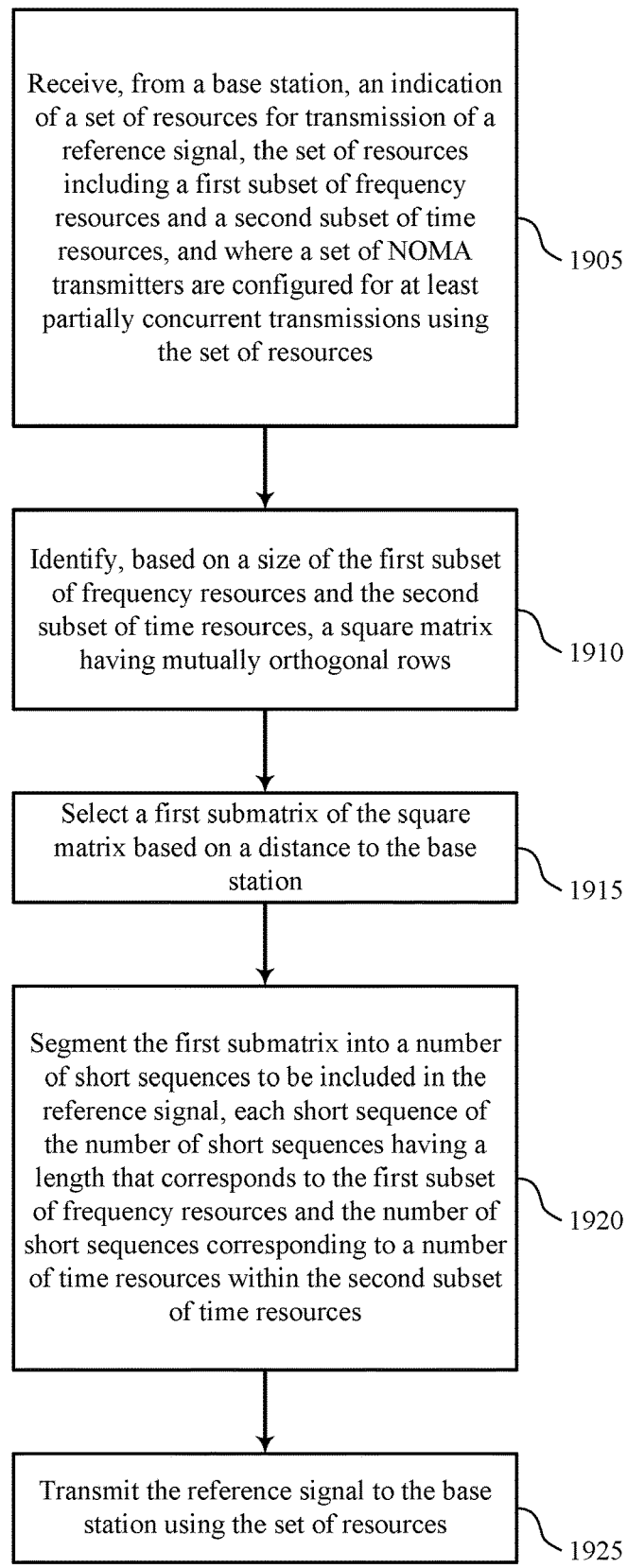

FIG. 19 shows a flowchart illustrating a method 1900 for reference signal transmission techniques for NOMA wireless communications in accordance with aspects of the present disclosure. The operations of method 1900 may be implemented by a UE 115 or its components as described herein. For example, the operations of method 1900 may be performed by a UE communications manager as described with reference to FIGS. 7 through 10. In some examples, a UE 115 may execute a set of codes to control the functional elements of the device to perform the functions described below. Additionally or alternatively, the UE 115 may perform aspects of the functions described below using special-purpose hardware.

At 1905 the UE 115 may receive, from a base station, an indication of a set of resources for transmission of a reference signal, the set of resources including a first subset of frequency resources and a second subset of time resources, and wherein a plurality of NOMA transmitters are configured for at least partially concurrent transmissions using the set of resources (e.g., including a NOMA transmitter of UE 115). The operations of 1905 may be performed according to the methods described herein. In certain examples, aspects of the operations of 1905 may be performed by a reference signal resource manager as described with reference to FIGS. 7 through 10.

At 1910 the UE 115 may identify, based at least in part on a size of the first subset of frequency resources and the second subset of time resources, a square matrix having mutually orthogonal rows. The operations of 1910 may be performed according to the methods described herein. In certain examples, aspects of the operations of 1910 may be performed by a reference signal sequence manager as described with reference to FIGS. 7 through 10.

At 1915 the UE 115 may select a first submatrix of the square matrix based at least in part on a distance to the base station. The operations of 1915 may be performed according to the methods described herein. In certain examples, aspects of the operations of 1915 may be performed by a reference signal sequence manager as described with reference to FIGS. 7 through 10.

At 1920 the UE 115 may segment the first submatrix into a number of short sequences to be included in the reference signal, each short sequence of the number of short sequences having a length that corresponds to the first subset of frequency resources and the number of short sequences corresponding to a number of time resources within the second subset of time resources. The operations of 1920 may be performed according to the methods described herein. In certain examples, aspects of the operations of 1920 may be performed by a reference signal sequence manager as described with reference to FIGS. 7 through 10.

At 1925 the UE 115 may transmit the reference signal to the base station using the set of resources. The operations of 1925 may be performed according to the methods described herein. In certain examples, aspects of the operations of 1925 may be performed by a reference signal transmission manager as described with reference to FIGS. 7 through 10.

Figure 20:
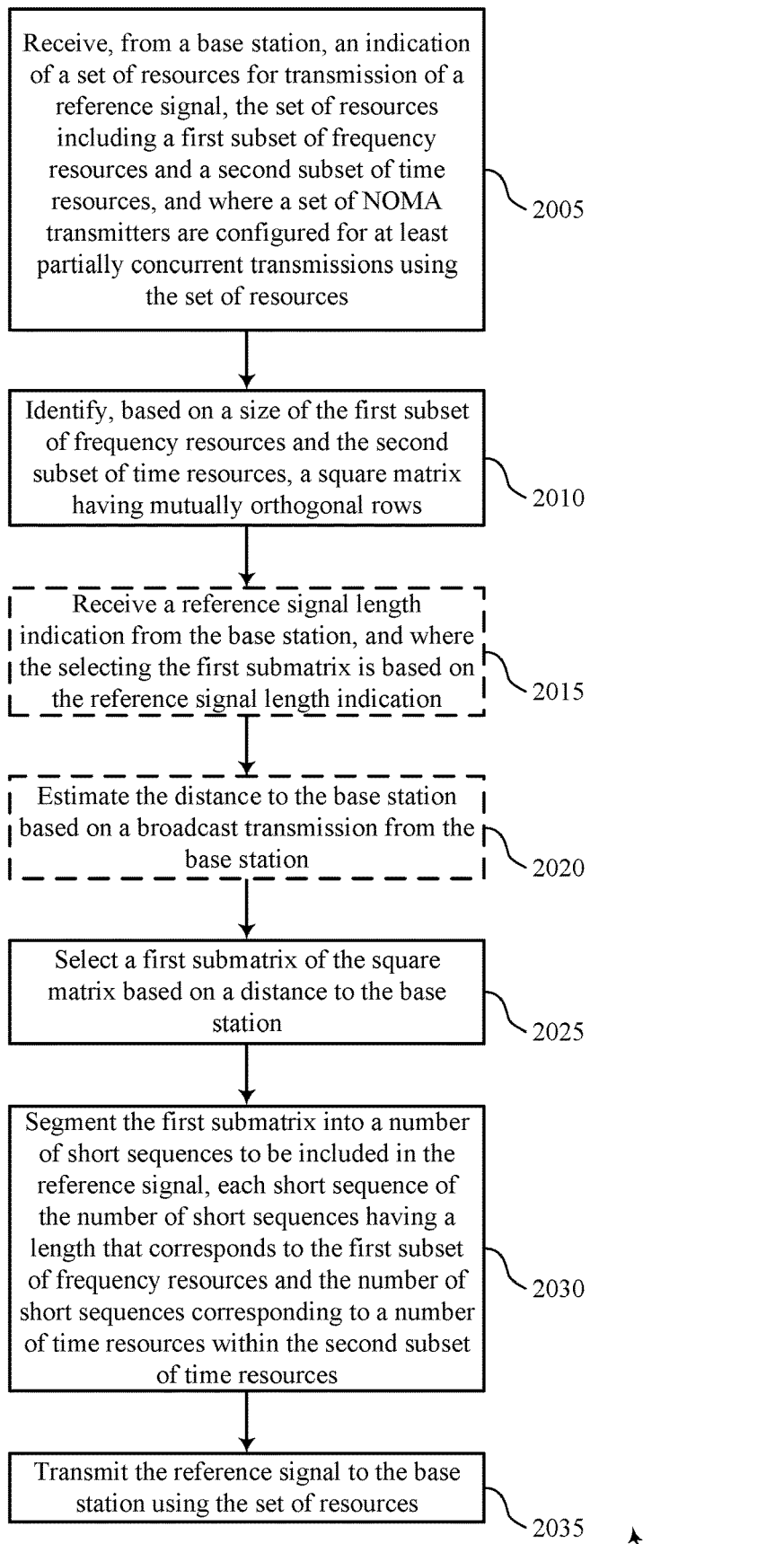

FIG. 20 shows a flowchart illustrating a method 2000 for reference signal transmission techniques for NOMA wireless communications in accordance with aspects of the present disclosure. The operations of method 2000 may be implemented by a UE 115 or its components as described herein. For example, the operations of method 2000 may be performed by a UE communications manager as described with reference to FIGS. 7 through 10. In some examples, a UE 115 may execute a set of codes to control the functional elements of the device to perform the functions described below. Additionally or alternatively, the UE 115 may perform aspects of the functions described below using special-purpose hardware.

At 2005 the UE 115 may receive, from a base station, an indication of a set of resources for transmission of a reference signal, the set of resources including a first subset of frequency resources and a second subset of time resources, and wherein a plurality of NOMA transmitters are configured for at least partially concurrent transmissions using the set of resources (e.g., including a NOMA transmitter of UE 115). The operations of 2005 may be performed according to the methods described herein. In certain examples, aspects of the operations of 2005 may be performed by a reference signal resource manager as described with reference to FIGS. 7 through 10.

At 2010 the UE 115 may identify, based at least in part on a size of the first subset of frequency resources and the second subset of time resources, a square matrix having mutually orthogonal rows. The operations of 2010 may be performed according to the methods described herein. In certain examples, aspects of the operations of 2010 may be performed by a reference signal sequence manager as described with reference to FIGS. 7 through 10.

Optionally, at 2015 the UE 115 may receive a reference signal length indication from the base station, and wherein the selecting the first submatrix is based at least in part on the reference signal length indication. The operations of 2015 may be performed according to the methods described herein. In certain examples, aspects of the operations of 2015 may be performed by a reference signal resource manager as described with reference to FIGS. 7 through 10. Additionally or alternatively, at 2020 the UE 115 may estimate the distance to the base station based at least in part on a broadcast transmission from the base station. The operations of 2020 may be performed according to the methods described herein. In certain examples, aspects of the operations of 2020 may be performed by a distance estimation component as described with reference to FIGS. 7 through 10.

At 2025 the UE 115 may select a first submatrix of the square matrix based at least in part on a distance to the base station. The operations of 2025 may be performed according to the methods described herein. In certain examples, aspects of the operations of 2025 may be performed by a reference signal sequence manager as described with reference to FIGS. 7 through 10.

At 2030 the UE 115 may segment the first submatrix into a number of short sequences to be included in the reference signal, each short sequence of the number of short sequences having a length that corresponds to the first subset of frequency resources and the number of short sequences corresponding to a number of time resources within the second subset of time resources. The operations of 2030 may be performed according to the methods described herein. In certain examples, aspects of the operations of 2030 may be performed by a reference signal sequence manager as described with reference to FIGS. 7 through 10.

At 2035 the UE 115 may transmit the reference signal to the base station using the set of resources. The operations of 2035 may be performed according to the methods described herein. In certain examples, aspects of the operations of 2035 may be performed by a reference signal transmission manager as described with reference to FIGS. 7 through 10.

Figure 21:
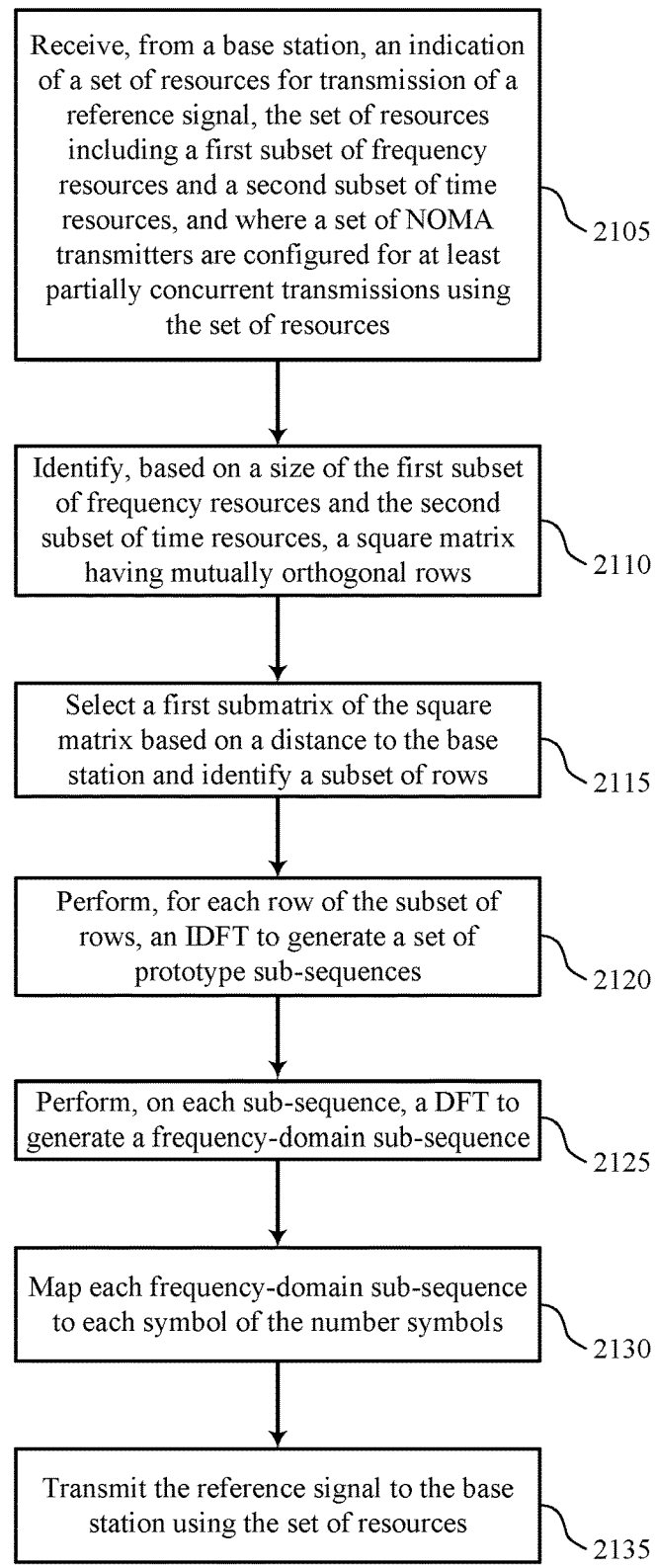

FIG. 21 shows a flowchart illustrating a method 2100 for reference signal transmission techniques for NOMA wireless communications in accordance with aspects of the present disclosure. The operations of method 2100 may be implemented by a UE 115 or its components as described herein. For example, the operations of method 2100 may be performed by a UE communications manager as described with reference to FIGS. 7 through 10. In some examples, a UE 115 may execute a set of codes to control the functional elements of the device to perform the functions described below. Additionally or alternatively, the UE 115 may perform aspects of the functions described below using special-purpose hardware.

At 2105 the UE 115 may receive, from a base station, an indication of a set of resources for transmission of a reference signal, the set of resources including a first subset of frequency resources and a second subset of time resources, and wherein a plurality of NOMA transmitters are configured for at least partially concurrent transmissions using the set of resources (e.g., including a NOMA transmitter of UE 115). The operations of 2105 may be performed according to the methods described herein. In certain examples, aspects of the operations of 2105 may be performed by a reference signal resource manager as described with reference to FIGS. 7 through 10.

At 2110 the UE 115 may identify, based at least in part on a size of the first subset of frequency resources and the second subset of time resources, a square matrix having mutually orthogonal rows. The operations of 2110 may be performed according to the methods described herein. In certain examples, aspects of the operations of 2110 may be performed by a reference signal sequence manager as described with reference to FIGS. 7 through 10.

At 2115 the UE 115 may select a first submatrix of the square matrix based at least in part on a distance to the base station and identify a subset of rows of the square matrix. The operations of 2115 may be performed according to the methods described herein. In certain examples, aspects of the operations of 2115 may be performed by a reference signal sequence manager as described with reference to FIGS. 7 through 10.

At 2120 the UE 115 may perform, for each row of the subset of rows, an IDFT to generate a set of prototype sequences. The operations of 2120 may be performed according to the methods described herein. In certain examples, aspects of the operations of 2120 may be performed by a reference signal sequence manager as described with reference to FIGS. 7 through 10.

At 2125 the UE 115 may perform, on each sub-sequence, a discrete DFT to generate a frequency-domain sub-sequence. The operations of 2125 may be performed according to the methods described herein. In certain examples, aspects of the operations of 2125 may be performed by a reference signal sequence manager as described with reference to FIGS. 7 through 10.

At 2130 the UE 115 may map each frequency-domain sub-sequence to each symbol of the number symbols. The operations of 2130 may be performed according to the methods described herein. In certain examples, aspects of the operations of 2130 may be performed by a resource mapping component as described with reference to FIGS. 7 through 10.

At 2135 the UE 115 may transmit the reference signal to the base station using the set of resources. The operations of 2135 may be performed according to the methods described herein. In certain examples, aspects of the operations of 2135 may be performed by a reference signal transmission manager as described with reference to FIGS. 7 through 10.

Figure 22:
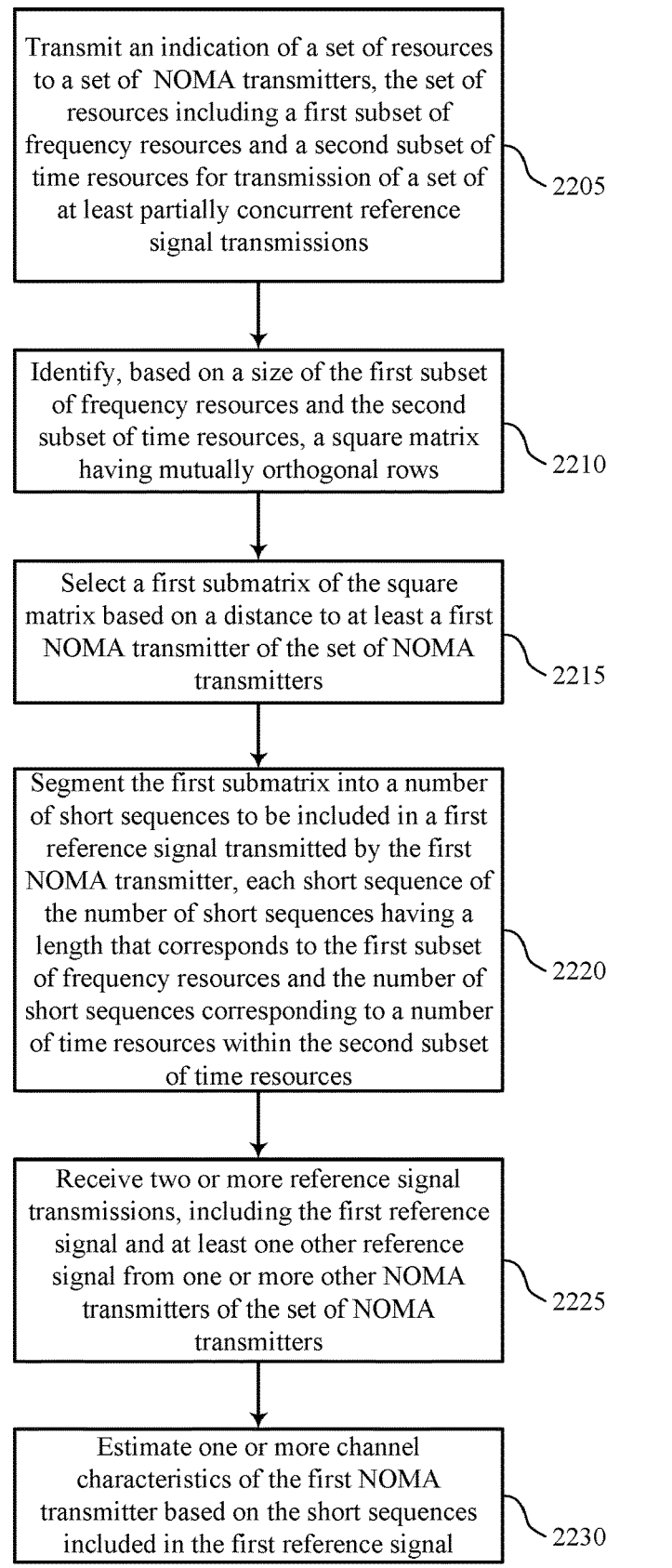

FIG. 22 shows a flowchart illustrating a method 2200 for reference signal transmission techniques for NOMA wireless communications in accordance with aspects of the present disclosure. The operations of method 2200 may be implemented by a base station 105 or its components as described herein. For example, the operations of method 2200 may be performed by a base station communications manager as described with reference to FIGS. 11 through 14. In some examples, a base station 105 may execute a set of codes to control the functional elements of the device to perform the functions described below. Additionally or alternatively, the base station 105 may perform aspects of the functions described below using special-purpose hardware.

At 2205 the base station 105 may transmit an indication of a set of resources to a plurality of NOMA transmitters, the set of resources including a first subset of frequency resources and a second subset of time resources for transmission of a plurality of at least partially concurrent reference signal transmissions. The operations of 2205 may be performed according to the methods described herein. In certain examples, aspects of the operations of 2205 may be performed by a reference signal resource manager as described with reference to FIGS. 11 through 14.

At 2210 the base station 105 may identify, based at least in part on a size of the first subset of frequency resources and the second subset of time resources, a square matrix having mutually orthogonal rows. The operations of 2210 may be performed according to the methods described herein. In certain examples, aspects of the operations of 2210 may be performed by a reference signal sequence manager as described with reference to FIGS. 11 through 14.

At 2215 the base station 105 may select a first submatrix of the square matrix based at least in part on a distance to at least a first NOMA transmitter of the plurality of NOMA transmitters. The operations of 2215 may be performed according to the methods described herein. In certain examples, aspects of the operations of 2215 may be performed by a reference signal sequence manager as described with reference to FIGS. 11 through 14.

At 2220 the base station 105 may segment the first submatrix into a number of short sequences to be included in a first reference signal transmitted by the first NOMA transmitter, each short sequence of the number of short sequences having a length that corresponds to the first subset of frequency resources and the number of short sequences corresponding to a number of time resources within the second subset of time resources. The operations of 2220 may be performed according to the methods described herein. In certain examples, aspects of the operations of 2220 may be performed by a reference signal sequence manager as described with reference to FIGS. 11 through 14.

At 2225 the base station 105 may receive two or more reference signal transmissions, including the first reference signal and at least one other reference signal from one or more other NOMA transmitters of the plurality of NOMA transmitters. The operations of 2225 may be performed according to the methods described herein. In certain examples, aspects of the operations of 2225 may be performed by a NOMA receiver as described with reference to FIGS. 11 through 14.

At 2230 the base station 105 may estimate one or more channel characteristics of the first NOMA transmitter based at least in part on the short sequences included in the first reference signal. The operations of 2230 may be performed according to the methods described herein. In certain examples, aspects of the operations of 2230 may be performed by a channel estimation component as described with reference to FIGS. 11 through 14.

Figure 23:
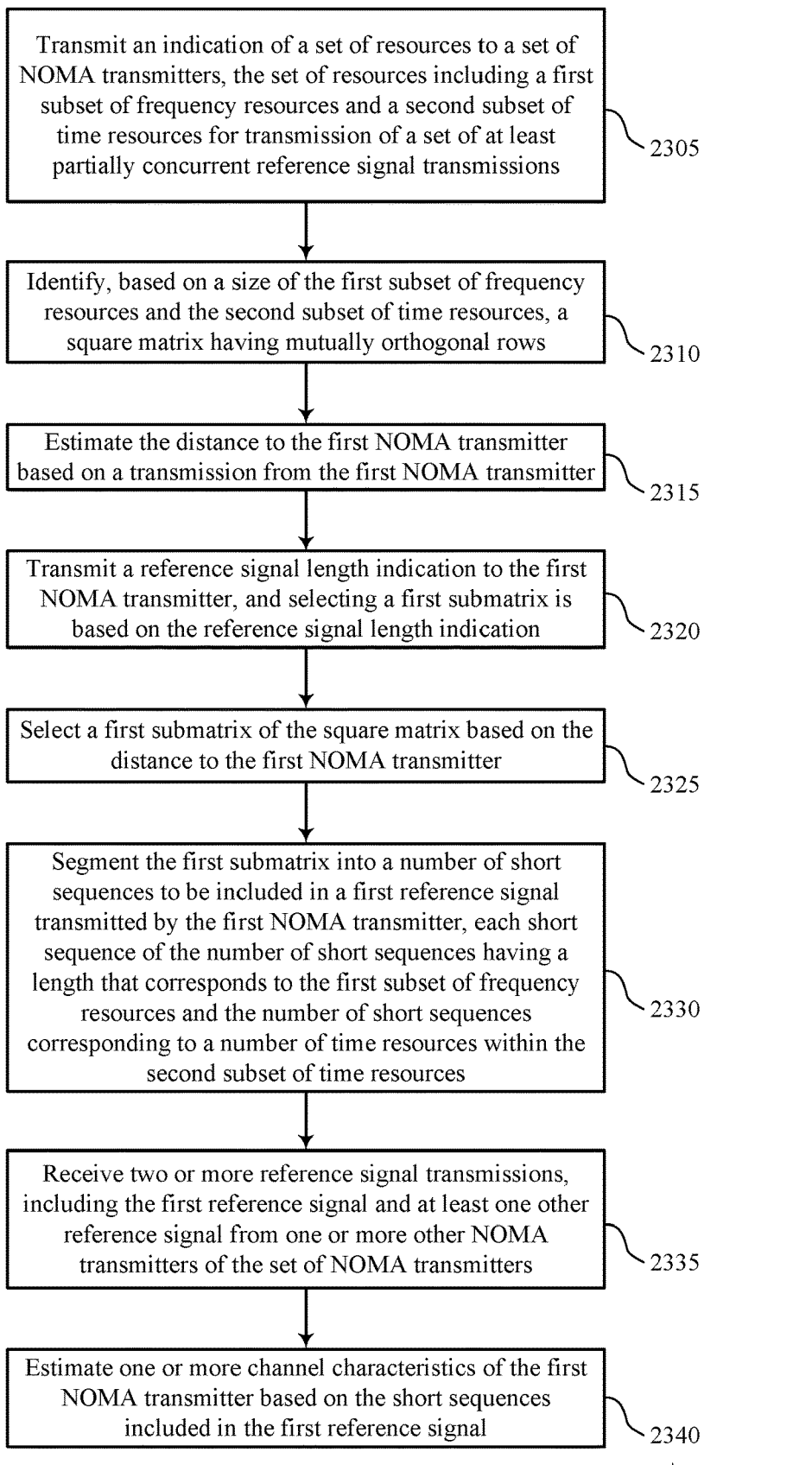

FIG. 23 shows a flowchart illustrating a method 2300 for reference signal transmission techniques for NOMA wireless communications in accordance with aspects of the present disclosure. The operations of method 2300 may be implemented by a base station 105 or its components as described herein. For example, the operations of method 2300 may be performed by a base station communications manager as described with reference to FIGS. 11 through 14. In some examples, a base station 105 may execute a set of codes to control the functional elements of the device to perform the functions described below. Additionally or alternatively, the base station 105 may perform aspects of the functions described below using special-purpose hardware.

At 2305 the base station 105 may transmit an indication of a set of resources to a plurality of NOMA transmitters, the set of resources including a first subset of frequency resources and a second subset of time resources for transmission of a plurality of at least partially concurrent reference signal transmissions. The operations of 2305 may be performed according to the methods described herein. In certain examples, aspects of the operations of 2305 may be performed by a reference signal resource manager as described with reference to FIGS. 11 through 14.

At 2310 the base station 105 may identify, based at least in part on a size of the first subset of frequency resources and the second subset of time resources, a square matrix having mutually orthogonal rows. The operations of 2310 may be performed according to the methods described herein. In certain examples, aspects of the operations of 2310 may be performed by a reference signal sequence manager as described with reference to FIGS. 11 through 14.

At 2315 the base station 105 may estimate the distance to the first NOMA transmitter based at least in part on a transmission from the first NOMA transmitter. The operations of 2315 may be performed according to the methods described herein. In certain examples, aspects of the operations of 2315 may be performed by a distance estimation component as described with reference to FIGS. 11 through 14.

At 2320 the base station 105 may transmit a reference signal length indication to the first NOMA transmitter, and wherein the selecting the first submatrix is based at least in part on the reference signal length indication. The operations of 2320 may be performed according to the methods described herein. In certain examples, aspects of the operations of 2320 may be performed by a reference signal resource manager as described with reference to FIGS. 11 through 14.

At 2325 the base station 105 may select a first submatrix of the square matrix based on the distance to the first NOMA transmitter. The operations of 2325 may be performed according to the methods described herein. In certain examples, aspects of the operations of 2325 may be performed by a reference signal sequence manager as described with reference to FIGS. 11 through 14.

At 2330 the base station 105 may segment the first submatrix into a number of short sequences to be included in a first reference signal transmitted by the first NOMA transmitter, each short sequence of the number of short sequences having a length that corresponds to the first subset of frequency resources and the number of short sequences corresponding to a number of time resources within the second subset of time resources. The operations of 2330 may be performed according to the methods described herein. In certain examples, aspects of the operations of 2330 may be performed by a reference signal sequence manager as described with reference to FIGS. 11 through 14.

At 2335 the base station 105 may receive two or more reference signal transmissions, including the first reference signal and at least one other reference signal from one or more other NOMA transmitters of the plurality of NOMA transmitters. The operations of 2335 may be performed according to the methods described herein. In certain examples, aspects of the operations of 2335 may be performed by a NOMA receiver as described with reference to FIGS. 11 through 14.

At 2340 the base station 105 may estimate one or more channel characteristics of the first NOMA transmitter based at least in part on the short sequences included in the first reference signal. The operations of 2340 may be performed according to the methods described herein. In certain examples, aspects of the operations of 2340 may be performed by a channel estimation component as described with reference to FIGS. 11 through 14.

Figure 24:
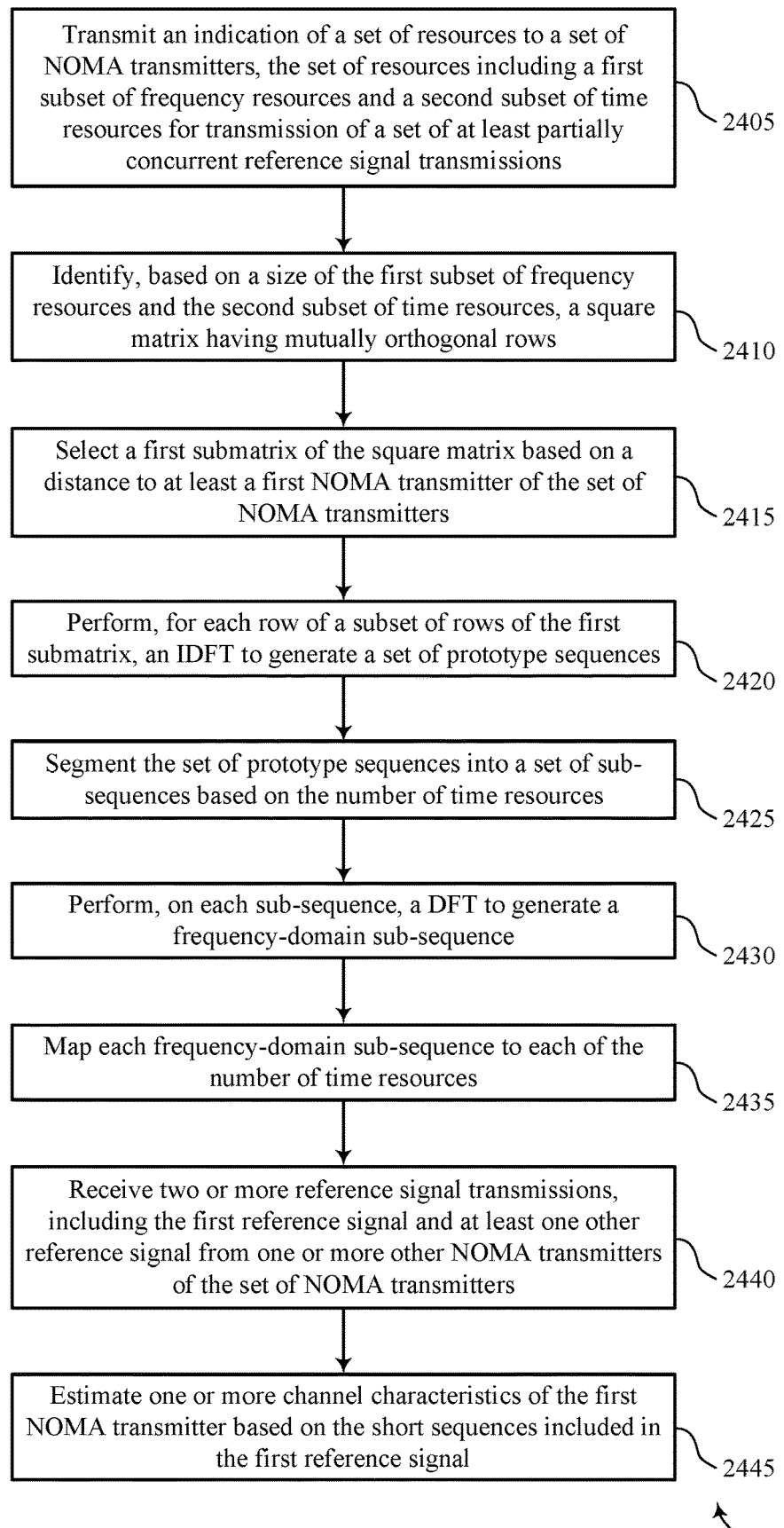

FIG. 24 shows a flowchart illustrating a method 2400 for reference signal transmission techniques for NOMA wireless communications in accordance with aspects of the present disclosure. The operations of method 2400 may be implemented by a base station 105 or its components as described herein. For example, the operations of method 2400 may be performed by a base station communications manager as described with reference to FIGS. 11 through 14. In some examples, a base station 105 may execute a set of codes to control the functional elements of the device to perform the functions described below. Additionally or alternatively, the base station 105 may perform aspects of the functions described below using special-purpose hardware.

At 2405 the base station 105 may transmit an indication of a set of resources to a plurality of NOMA transmitters, the set of resources including a first subset of frequency resources and a second subset of time resources for transmission of a plurality of at least partially concurrent reference signal transmissions. The operations of 2405 may be performed according to the methods described herein. In certain examples, aspects of the operations of 2405 may be performed by a reference signal resource manager as described with reference to FIGS. 11 through 14.

At 2410 the base station 105 may identify, based at least in part on a size of the first subset of frequency resources and the second subset of time resources, a square matrix having mutually orthogonal rows. The operations of 2410 may be performed according to the methods described herein. In certain examples, aspects of the operations of 2410 may be performed by a reference signal sequence manager as described with reference to FIGS. 11 through 14.

At 2415 the base station 105 may select a first submatrix of the square matrix based at least in part on a distance to at least a first NOMA transmitter of the plurality of NOMA transmitters. The operations of 2415 may be performed according to the methods described herein. In certain examples, aspects of the operations of 2415 may be performed by a reference signal sequence manager as described with reference to FIGS. 11 through 14.

At 2420 the base station 105 may perform, for each row of the subset of rows, an IDFT to generate a set of prototype sequences. The operations of 2420 may be performed according to the methods described herein. In certain examples, aspects of the operations of 2420 may be performed by a reference signal sequence manager as described with reference to FIGS. 11 through 14.

At 2425 the base station 105 may segment the set of prototype sequences into a plurality of sub-sequences based at least in part on the number of time resources. The operations of 2425 may be performed according to the methods described herein. In certain examples, aspects of the operations of 2425 may be performed by a reference signal sequence manager as described with reference to FIGS. 11 through 14.

At 2430 the base station 105 may perform, on each sub-sequence, a DFT to generate a frequency-domain sub-sequence. The operations of 2430 may be performed according to the methods described herein. In certain examples, aspects of the operations of 2430 may be performed by a reference signal sequence manager as described with reference to FIGS. 11 through 14.

At 2435 the base station 105 may map each frequency-domain sub-sequence to each of the number of time resources. The operations of 2435 may be performed according to the methods described herein. In certain examples, aspects of the operations of 2435 may be performed by a resource mapping component as described with reference to FIGS. 11 through 14.

At 2440 the base station 105 may receive two or more reference signal transmissions, including the first reference signal and at least one other reference signal from one or more other NOMA transmitters of the plurality of NOMA transmitters. The operations of 2440 may be performed according to the methods described herein. In certain examples, aspects of the operations of 2440 may be performed by a NOMA receiver as described with reference to FIGS. 11 through 14.

At 2445 the base station 105 may estimate one or more channel characteristics of the first NOMA transmitter based at least in part on the short sequences included in the first reference signal. The operations of 2445 may be performed according to the methods described herein. In certain examples, aspects of the operations of 2445 may be performed by a channel estimation component as described with reference to FIGS. 11 through 14.

It should be noted that the methods described above describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE, LTE-A, and LTE-A Pro are releases of UMTS that use E-UTRA. UTRA, E-UTRA, UMTS, LTE, LTE-A, LTE-A Pro, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR applications.

A macro cell generally covers a relatively large geographic area (e.g., several kilometers in radius) and may allow unrestricted access by UEs 115 with service subscriptions with the network provider. A small cell may be associated with a lower-powered base station 105, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs 115 with service subscriptions with the network provider. A femto cell may also cover a small geographic area (e.g., a home) and may provide restricted access by UEs 115 having an association with the femto cell (e.g., UEs 115 in a closed subscriber group (CSG), UEs 115 for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications system 100 or systems described herein may support synchronous or asynchronous operation. For synchronous operation, the base stations 105 may have similar frame timing, and transmissions from different base stations 105 may be approximately aligned in time. For asynchronous operation, the base stations 105 may have different frame timing, and transmissions from different base stations 105 may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
   receiving, from a base station, an indication of a set of resources for transmission of a reference signal, wherein a plurality of non-orthogonal multiple access (NOMA) transmitters are configured for at least partially concurrent transmissions using the set of resources;
   identifying, based at least in part on the set of resources, a plurality of short sequences to be included in the reference signal, each short sequence of the plurality of short sequences having a root index and cyclic shift that provides a cross-correlation with other of the plurality of short sequences that is below a threshold value;
   concatenating the plurality of short sequences to generate a reference signal sequence for the reference signal; and
   transmitting the reference signal to the base station.

2. The method of claim 1, wherein the set of resources comprise frequency resources and time resources, and wherein a first short sequence of the plurality of short sequences is applied to a first subset of the frequency resources that are located within a first subset of the time resources, and a second short sequence of the plurality of short sequences is applied to a second subset of the frequency resources that are located within a second subset of the time resources.

3. The method of claim 1, wherein the identifying the plurality of short sequences comprises:
   determining the root index and cyclic shift for each short sequence within a plurality of frequency domain resources; and
   mapping each of the plurality of short sequences to each of a corresponding plurality of time domain resources.

4. The method of claim 1, wherein the plurality of short sequences each comprise a portion of a linear block code that can be successfully decoded if an error in receiving one or more portions of the linear block code occurs.

5. The method of claim 4, wherein the linear block code is an error-correcting code.

6. The method of claim 1, wherein the threshold value is based at least in part on a one or more of a cell radius of the base station, a multipath delay spread associated with the base station, or any combination thereof.

7. The method of claim 1, wherein the reference signal sequence allows for asynchronous reference signal transmissions from multiple transmitters.

8. The method of claim 1, wherein the identifying the plurality of short sequences comprises:
   identifying, based at least in part on the set of resources, a codebook containing a set of short sequences; and
   selecting a subset of the set of short sequences as the plurality of short sequences based at least in part on a user equipment (UE) identification.

9. The method of claim 1, wherein each short sequence of the plurality of short sequences is a constant-amplitude zero-autocorrelation (CAZAC) sequence, a pseudo-random noise (PN) sequence, a Kasami sequence, or a Golay sequence.

10. An apparatus for wireless communication, comprising:
    means for receiving, from a base station, an indication of a set of resources for transmission of a reference signal, wherein at least one non-orthogonal multiple access (NOMA) transmitter associated with the apparatus is configured for at least partially concurrent transmissions using the set of resources;
    means for identifying, based at least in part on the set of resources, a plurality of short sequences to be included in the reference signal, each short sequence of the plurality of short sequences having a root index and cyclic shift that provides a cross-correlation with other of the plurality of short sequences that is below a threshold value;
    means for concatenating the plurality of short sequences to generate a reference signal sequence for the reference signal; and
    means for transmitting the reference signal to the base station.

11. The apparatus of claim 10, wherein the set of resources comprise frequency resources and time resources, and wherein a first short sequence of the plurality of short sequences is applied to a first subset of the frequency resources that are located within a first subset of the time resources, and a second short sequence of the plurality of short sequences is applied to a second subset of the frequency resources that are located within a second subset of the time resources.

12. The apparatus of claim 10, wherein the means for the identifying the plurality of short sequences determines the root index and cyclic shift for each short sequence within a plurality of frequency domain resources, and maps each of the plurality of short sequences to each of a corresponding plurality of time domain resources.

13. The apparatus of claim 10, wherein the plurality of short sequences each comprise a portion of a linear block code that can be successfully decoded if an error in receiving one or more portions of the linear block code occurs.

14. The apparatus of claim 10, wherein the means for the identifying the plurality of short sequences identifies, based at least in part on the set of resources, a codebook containing a set of short sequences, and selects a subset of the set of short sequences as the plurality of short sequences based at least in part on a user equipment (UE) identification.

15. The apparatus of claim 10, wherein each short sequence of the plurality of short sequences is a constant-amplitude zero-autocorrelation (CAZAC) sequence, a pseudo-random noise (PN) sequence, a Kasami sequence, or a Golay sequence.

16. An apparatus for wireless communication, comprising:
   a processor;
   memory in electronic communication with the processor; and
   instructions stored in the memory and executable by the processor to cause the apparatus to:
      receive, from a base station, an indication of a set of resources for transmission of a reference signal, wherein at least one non-orthogonal multiple access (NOMA) transmitter associated with the apparatus is configured for at least partially concurrent transmissions using the set of resources;
      identify, based at least in part on the set of resources, a plurality of short sequences to be included in the reference signal, each short sequence of the plurality of short sequences having a root index and cyclic shift that provides a cross-correlation with other of the plurality of short sequences that is below a threshold value;
      concatenate the plurality of short sequences to generate a reference signal sequence for the reference signal; and
      transmit the reference signal to the base station.

17. The apparatus of claim 16, wherein the set of resources comprise frequency resources and time resources, and wherein a first short sequence of the plurality of short sequences is applied to a first subset of the frequency resources that are located within a first subset of the time resources, and a second short sequence of the plurality of short sequences is applied to a second subset of the frequency resources that are located within a second subset of the time resources.

18. The apparatus of claim 16, wherein the instructions to cause the apparatus to identify the plurality of short sequences comprise instructions to cause the apparatus to:
   determine the root index and cyclic shift for each short sequence within a plurality of frequency domain resources; and
   map each of the plurality of short sequences to each of a corresponding plurality of time domain resources.

19. The apparatus of claim 16, wherein the plurality of short sequences each comprise a portion of a linear block code that can be successfully decoded if an error in receiving one or more portions of the linear block code occurs.

20. The apparatus of claim 19, wherein the linear block code is an error-correcting code.

21. The apparatus of claim 16, wherein the threshold value is based at least in part on a one or more of a cell radius of the base station, a multipath delay spread associated with the base station, or any combination thereof.

22. The apparatus of claim 16, wherein the reference signal sequence allows for asynchronous reference signal transmissions from multiple transmitters.

23. The apparatus of claim 16, wherein the instructions to cause the apparatus to identify the plurality of short sequences comprise instructions to cause the apparatus to:
   identify, based at least in part on the set of resources, a codebook containing a set of short sequences; and
   select a subset of the set of short sequences as the plurality of short sequences based at least in part on a user equipment (UE) identification.

24. The apparatus of claim 16, wherein each short sequence of the plurality of short sequences is a constant-amplitude zero-autocorrelation (CAZAC) sequence, a pseudo-random noise (PN) sequence, a Kasami sequence, or a Golay sequence.

25. A non-transitory computer-readable medium storing code for wireless communication, the code comprising instructions executable by a processor to:
   receive, from a base station, an indication of a set of resources for transmission of a reference signal, wherein at least one non-orthogonal multiple access (NOMA) transmitter operatively coupled to the processor is configured for at least partially concurrent transmissions using the set of resources;
   identify, based at least in part on the set of resources, a plurality of short sequences to be included in the reference signal, each short sequence of the plurality of short sequences having a root index and cyclic shift that provides a cross-correlation with other of the plurality of short sequences that is below a threshold value;
   concatenate the plurality of short sequences to generate a reference signal sequence for the reference signal; and
   transmit the reference signal to the base station.

26. The non-transitory computer-readable medium of claim 25, wherein the set of resources comprise frequency resources and time resources, and wherein a first short sequence of the plurality of short sequences is applied to a first subset of the frequency resources that are located within a first subset of the time resources, and a second short sequence of the plurality of short sequences is applied to a second subset of the frequency resources that are located within a second subset of the time resources.

27. The non-transitory computer-readable medium of claim 25, wherein the code comprising instructions to identify the plurality of short sequences further comprises instructions to determine the root index and cyclic shift for each short sequence within a plurality of frequency domain resources, and maps each of the plurality of short sequences to each of a corresponding plurality of time domain resources.

28. The non-transitory computer-readable medium of claim 25, wherein the plurality of short sequences each comprise a portion of a linear block code that can be successfully decoded if an error in receiving one or more portions of the linear block code occurs.

29. The non-transitory computer-readable medium of claim 25, wherein the code comprising instructions to identify the plurality of short sequences further comprises instructions to identify, based at least in part on the set of resources, a codebook containing a set of short sequences, and selects a subset of the set of short sequences as the plurality of short sequences based at least in part on a user equipment (UE) identification.

30. The non-transitory computer-readable medium of claim 25, wherein each short sequence of the plurality of short sequences is a constant-amplitude zero-autocorrelation (CAZAC) sequence, a pseudo-random noise (PN) sequence, a Kasami sequence, or a Golay sequence.

* * * * *